United States Patent
Kohama et al.

(10) Patent No.: US 11,075,235 B2
(45) Date of Patent: Jul. 27, 2021

(54) IMAGE SENSOR MOUNTING BASE, IMAGING DEVICE, AND IMAGING MODULE

(71) Applicant: KYOCERA Corporation, Kyoto (JP)

(72) Inventors: Kenichi Kohama, Satsumasendai (JP); Fumiaki Takeshita, Esslingen (DE)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/345,285

(22) PCT Filed: Oct. 26, 2017

(86) PCT No.: PCT/JP2017/038663
§ 371 (c)(1),
(2) Date: Apr. 26, 2019

(87) PCT Pub. No.: WO2018/079644
PCT Pub. Date: May 3, 2018

(65) Prior Publication Data
US 2019/0267416 A1 Aug. 29, 2019

(30) Foreign Application Priority Data

Oct. 27, 2016 (JP) .............................. JP2016-210500

(51) Int. Cl.
*H01L 27/146* (2006.01)
*H01L 23/14* (2006.01)
(Continued)

(52) U.S. Cl.
CPC ........ *H01L 27/14607* (2013.01); *H01L 23/14* (2013.01); *H01L 25/04* (2013.01);
(Continued)

(58) Field of Classification Search
CPC ............... H01L 27/14607; H01L 25/18; H01L 27/14618; H01L 27/14625; H01L 27/146;
(Continued)

(56) References Cited

U.S. PATENT DOCUMENTS

2005/0101052 A1* 5/2005 Kobayashi ............ H01L 21/481
438/106
2017/0264799 A1* 9/2017 Wang ................... H04N 5/2258

FOREIGN PATENT DOCUMENTS

JP     2005-292242 A    10/2005
JP     2007-150034 A     6/2007
(Continued)

*Primary Examiner* — Nelson Garces
(74) *Attorney, Agent, or Firm* — Volpe Koenig

(57) ABSTRACT

An image sensor mounting base includes a substrate, and a first, a second, a third and a fourth electrode pad. The substrate has an upper surface including a first mount area where a first image sensor is mountable, and a second mount area where a second image sensor is mountable. The second mount area is spaced from the first mount area. The first and second electrode pads are located on the upper surface of the substrate and across the first mount area each other. The third and fourth electrode pads on the upper surface of the substrate are spaced from the first electrode pad and the second electrode pad and face each other across the second mount area. The substrate has, on the upper surface, a recess between the third electrode pad and the fourth electrode pad. The second mount area is located on a bottom of the recess.

10 Claims, 17 Drawing Sheets

(51) Int. Cl.
  *H04N 5/225*     (2006.01)
  *H04N 5/3745*    (2011.01)
  *H01L 25/18*     (2006.01)
  *H04N 5/369*     (2011.01)
  *H01L 25/04*     (2014.01)
  *H01L 23/13*     (2006.01)
  *H01L 23/15*     (2006.01)

(52) U.S. Cl.
  CPC ............ *H01L 25/18* (2013.01); *H01L 27/146* (2013.01); *H01L 27/14618* (2013.01); *H01L 27/14625* (2013.01); *H04N 5/225* (2013.01); *H04N 5/2254* (2013.01); *H04N 5/2258* (2013.01); *H04N 5/369* (2013.01); *H04N 5/3745* (2013.01); *H01L 23/13* (2013.01); *H01L 23/15* (2013.01)

(58) Field of Classification Search
  CPC ......... H01L 25/04; H01L 23/14; H01L 23/13; H01L 23/15; H01L 2224/49175; H01L 2224/48227; H01L 2224/48091; H01L 2924/15153; H01L 2224/48137; H01L 23/04; H01L 25/00; H01L 27/14689; H04N 5/225; H04N 5/369; H04N 5/2254; H04N 5/2258; H04N 5/3745; H04N 5/2253; H04N 5/378; H04N 5/2257
  USPC ................................................. 257/222, 432
  See application file for complete search history.

(56)  References Cited

FOREIGN PATENT DOCUMENTS

| | | |
|---|---|---|
| JP | 2007-306282 A | 11/2007 |
| JP | 2014-232851 A | 12/2014 |
| JP | 2016-092436 A | 5/2016 |
| JP | 2016-122723 A | 7/2016 |
| WO | 2013/081156 A1 | 6/2013 |

* cited by examiner

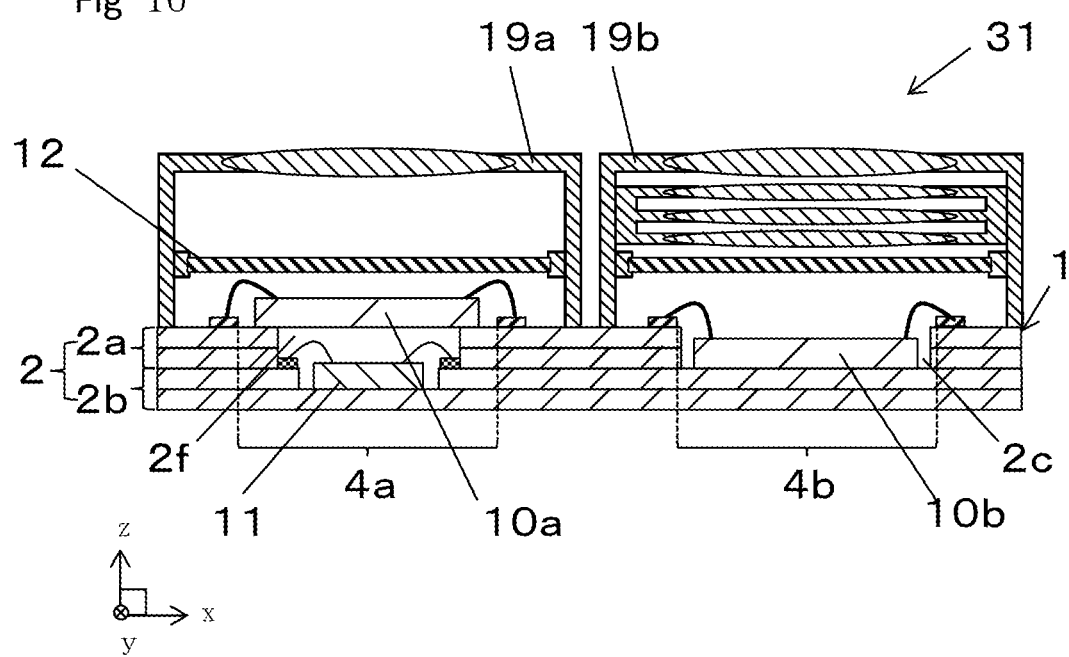

IMAGE SENSOR MOUNTING BASE, IMAGING DEVICE, AND IMAGING MODULE

FIELD

The present invention relates to an image sensor mounting base on which an image sensor, such as a charge coupled device (CCD) or a complementary metal oxide semiconductor (CMOS) device, is mountable, and to an imaging device and an imaging module.

BACKGROUND

A known image sensor mounting base may include a substrate formed from insulating layers. Also, a known imaging device includes an image sensor mounted on such an image sensor mounting base (refer to Japanese Unexamined Patent Application Publication No. 2016-92436).

To meet the recent demand for multifunctionality, an image sensor mounting base may receive two image sensors mounted with the technique described in Japanese Unexamined Patent Application Publication No. 2016-92436. The two image sensors may have different numbers of pixels, or may have different intended characteristics. For each image sensor, a lens barrel to be mounted on its upper surface, is selected with a different number of lenses or a different mechanism depending on the functions or intended characteristics of each image sensor.

BRIEF SUMMARY

An image sensor mounting base according to one aspect of the present invention includes a substrate, a first electrode pad, a second electrode pad, a third electrode pad, and a fourth electrode pad. The substrate has an upper surface including a first mount area on which a first image sensor is mountable, and a second mount area on which a second image sensor is mountable. The second mount area is spaced from the first mount area. The first electrode pad and the second electrode pad that are located on the upper surface of the substrate and across the first mount area each other. The third electrode pad and the fourth electrode pad on the upper surface of the substrate are spaced from the first electrode pad and the second electrode pad and face each other across the second mount area. The substrate has, on the upper surface, a recess between the third electrode pad and the fourth electrode pad. The second mount area are located on a bottom of the recess.

An imaging device according to another aspect of the present invention includes the image sensor mounting base according to the above aspect, a first image sensor mounted on the first mount area on the image sensor mounting base, and a second image sensor mounted on the second mount area on the image sensor mounting base.

An imaging module according to another aspect of the present invention includes the imaging device according to the above aspect, a first lens barrel bonded to an upper surface of the imaging device and surrounding the first mount area, and a second lens barrel bonded to the upper surface of the imaging device and surrounding the second mount area.

BRIEF DESCRIPTION OF DRAWINGS

FIG. 16 is an external cross-sectional view of an imaging module including an image sensor mounting base according to a ninth embodiment of the present invention.

DETAILED DESCRIPTION

Structures of Image Sensor Mounting Base and Imaging Device

Embodiments of the present invention will now be described by way of example with reference to the drawings. In the embodiments described below, an imaging device includes a first image sensor mounted on a first mount area and a second image sensor mounted on a second mount area on an image sensor mounting base. An imaging module includes the image sensor mounting base with each image sensor having a lens barrel mounted on its upper surface. Although the image sensor mounting base, the imaging device, and the imaging module may be arranged to have any of their faces upward or downward, they are herein defined using the orthogonal xyz coordinate system with the positive z-direction upward for ease of explanation.

First Embodiment

Figure 1A:
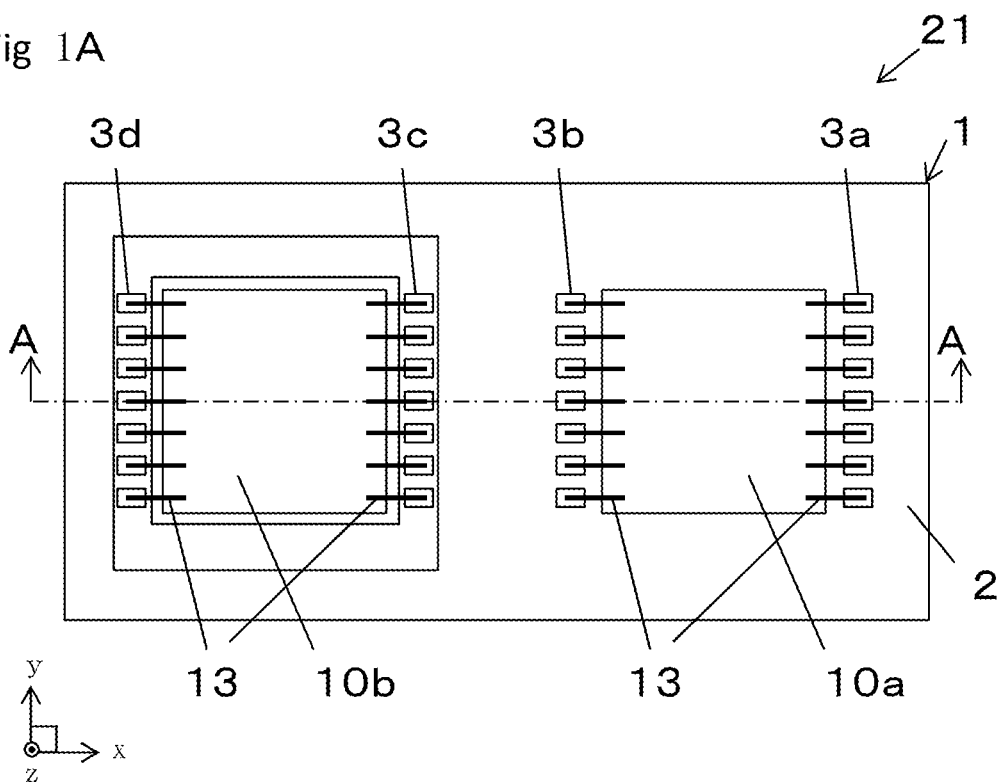
FIG. 1A is an external top view of an image sensor mounting base and an imaging device according to a first embodiment of the present invention.
Figure 1B:
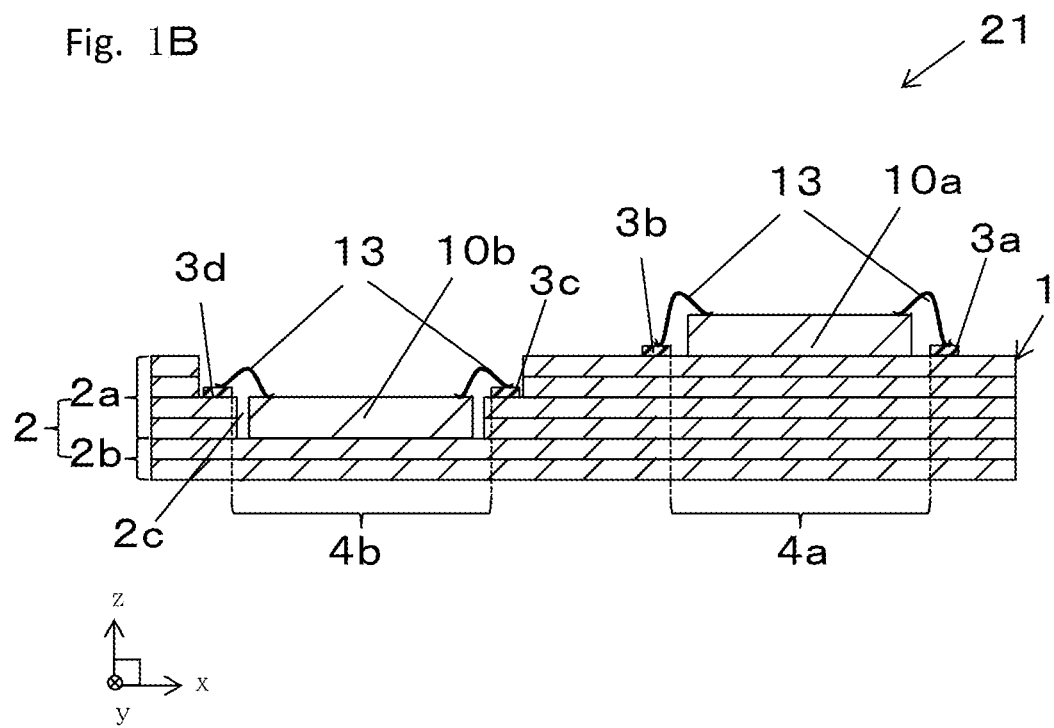
FIG. 1B is a cross-sectional view taken along line A-A in FIG. 1A.
Figure 2A:
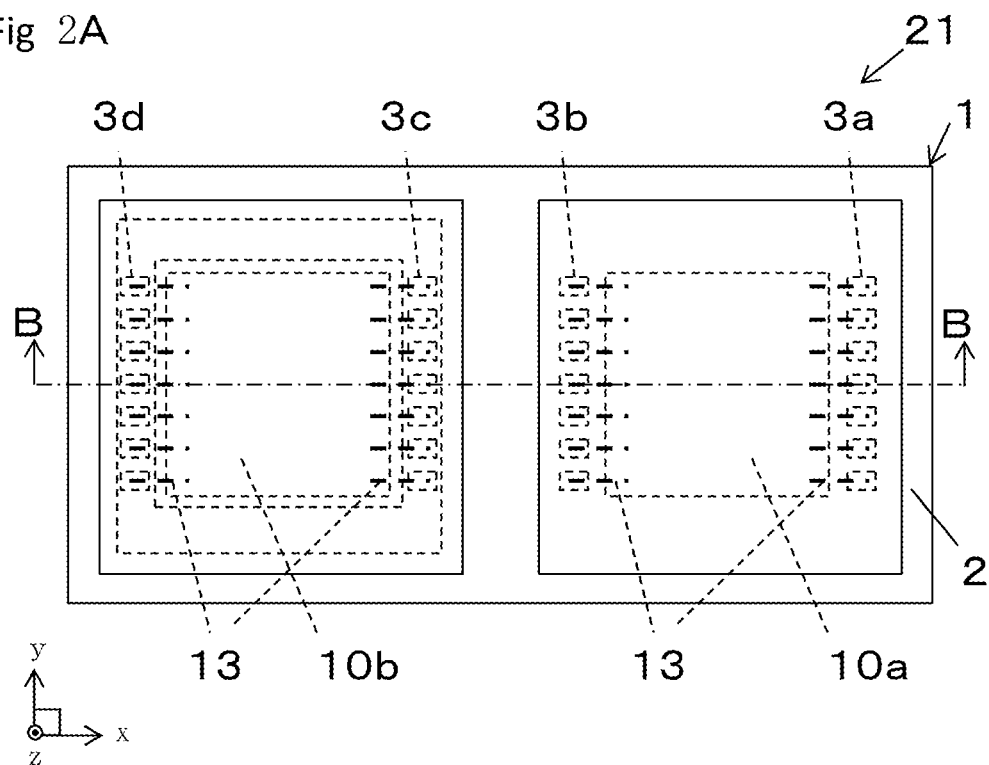
FIG. 2A is an external top view of an imaging device including the image sensor mounting base according to the first embodiment of the present invention.
Figure 2B:
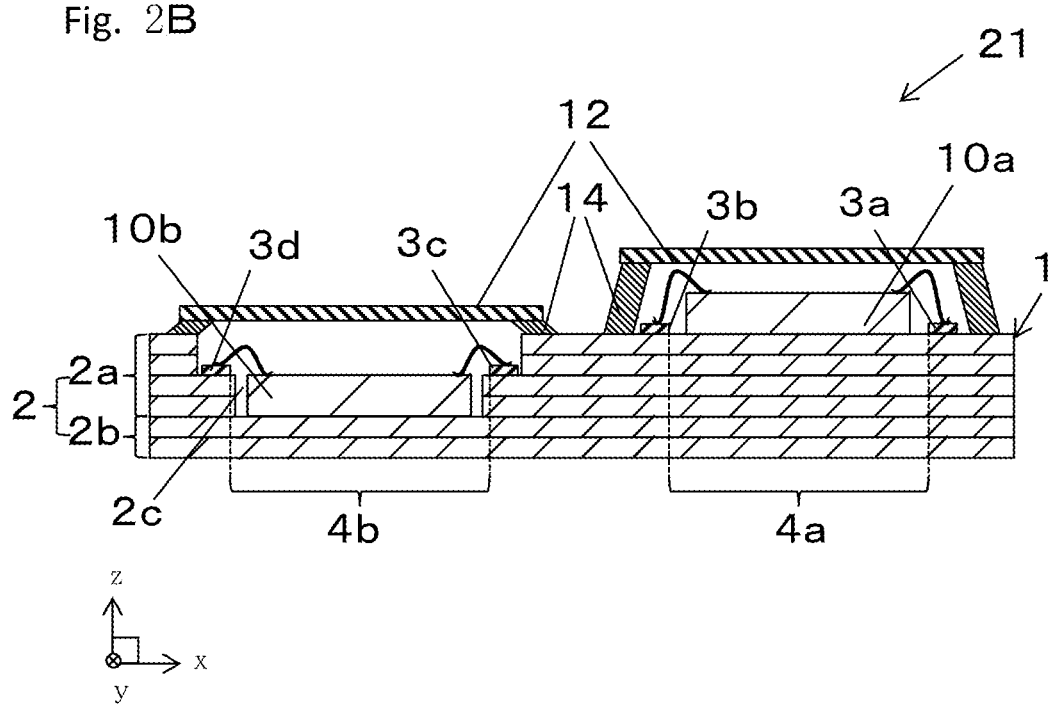
FIG. 2B is a cross-sectional view taken along line B-B in FIG. 2A.

An imaging device 21 and an image sensor mounting base 1 according to a first embodiment of the present invention will now be described with reference to FIGS. 1A to 6B. FIGS. 1A and 1B show the imaging device 21 without a lid 12 and associated components. FIGS. 2A, 2B, 5A, and 5B show the imaging device 21 with the lid 12 and associated components. FIGS. 3A, 3B, 4A, 4B, 6A, and 6B show an imaging module 31.

The image sensor mounting base 1 includes a substrate 2 having an upper surface including a first mount area 4a on which a first image sensor 10a is mountable, and a second mount area 4b on which a second image sensor 10b is mountable. The second mount area 4b is spaced from the first mount area 4a. The substrate 2 has, on its upper surface, first electrode pads 3a and second electrode pads 3b facing each other across the first mount area 4a. The substrate 2 has, on its upper surface, third electrode pads 3c and fourth electrode pads 3d spaced from the first electrode pads 3a and the second electrode pads 3b and facing each other across the second mount area 4b. The substrate 2 has, on its upper surface, a recess 2c between the third electrode pads 3c and the fourth electrode pads 3d. The second mount area 4b partially extends on the bottom of the recess 2c.

The image sensor mounting base 1 includes the substrate 2 having the upper surface including the first mount area 4a on which the first image sensor 10a is mountable, and the second mount area 4b on which the second image sensor 10b is mountable. The second mount area 4b is spaced from the first mount area 4a. The substrate 2 includes insulating layers formed from, for example, an electrical insulating ceramic material or a resin, such as plastics.

Examples of the electrical insulating ceramic material used for the substrate 2 include sintered aluminum oxide, sintered mullite, sintered silicon carbide, sintered aluminum nitride, sintered silicon nitride, and sintered glass ceramic. Examples of the resin used for forming the substrate 2 include an epoxy resin, a polyimide resin, an acryl resin, a phenolic resin, and a fluorine-based resin. Examples of the fluorine-based resin include a polytetrafluoroethylene resin.

The substrate 2 may be a laminate of multiple insulating layers stacked on one another. The insulating layers are formed from any of the above listed materials. The substrate 2 may include six insulating layers as shown in FIG. 1B, or may be formed from a single insulating layer, or may include two to five, or seven or more insulating layers. The substrate 2 including six or more insulating layers has a sufficiently large thickness and provides a sufficiently large wiring area. The substrate 2 including such layers can achieve improved electrical characteristics, and is less likely to warp, crack, or break. The substrate 2 including five insulating layers or less can be thinner.

The substrate 2 has a side length of, for example, about 3 mm to 10 cm, and may be rectangular or square as viewed from above. The substrate 2 has a thickness of, for example, at least 0.2 mm.

The substrate 2 may include pads for connecting to external circuits (external-circuit connecting pads) on any of the upper surface, side surfaces, or lower surface. The external-circuit connecting pads electrically connect the substrate 2 or the imaging device 21 to external circuit bases.

The image sensor mounting base 1 has the first mount area 4a on which the first image sensor 10a is mountable, and the second mount area 4b on which the second image sensor 10b is mountable. The first mount area 4a or the second mount area 4b is an area on which at least the first image sensor 10a or the second image sensor 10b is mountable. An electronic component or a semiconductor device other than the first image sensor 10a and the second image sensor 10b may be mounted in the first mount area 4a or the second mount area 4b.

The image sensor mounting base 1 includes the substrate 2 having, on its upper surface, the first electrode pads 3a and the second electrode pads 3b facing each other across the first mount area 4a. The substrate 2 in the image sensor mounting base 1 has, on its upper surface, the third electrode pads 3c and the fourth electrode pads 3d spaced from the first electrode pads 3a and the second electrode pads 3b and facing each other across the second mount area 4b.

The first mount area 4a is located between the first electrode pads 3a and the second electrode pads 3b. In other words, the first mount area 4a is defined by the inner ends or the outer ends of the first electrode pads 3a and the second electrode pads 3b. The first mount area 4a may have at least about the same size as or may be larger than the first image sensor 10a.

The second mount area 4b is located between the third electrode pads 3c and the fourth electrode pads 3d. In other words, the second mount area 4b is defined by the inner ends or outer ends of the third electrode pads 3c and the fourth electrode pads 3d. The second mount area 4b may have at least about the same size as or may be larger than the second image sensor 10b.

The first electrode pads 3a, the second electrode pads 3b, the third electrode pads 3c, and the fourth electrode pads 3d are areas electrically connected to the first image sensor 10a or the second image sensor 10b by wire bonding, and may extend outwardly or inwardly from the substrate 2. For example, although the second electrode pads 3b are connected to the third electrode pads 3c by wiring, any areas spaced from each other and connected by wire bonding as described above may function as the second electrode pads 3b and the third electrode pads 3c.

The substrate 2 may include, either inside or between its insulating layers, inner wires and feedthrough conductors that vertically connect the inner wires. The inner wires and the feedthrough conductors may be uncovered on the surface of the substrate 2. The inner wires or the feedthrough conductors may electrically connect the first electrode pads 3a, the second electrode pads 3b, the third electrode pads 3c, the fourth electrode pads 3d, and the external-circuit connecting pads.

For the substrate 2 formed from an electrical insulating ceramic material, the first electrode pads 3a, the second electrode pads 3b, the third electrode pads 3c, the fourth electrode pads 3d, the external-circuit connecting pads, the inner wires, and the feedthrough conductors may be formed from tungsten (W), molybdenum (Mo), manganese (Mn), silver (Ag), or copper (Cu), or an alloy containing one or more of these metals. For the substrate 2 formed from a resin, the first electrode pads 3a, the second electrode pads 3b, the third electrode pads 3c, the fourth electrode pads 3d, the external-circuit connecting pads, the inner wires, and the feedthrough conductors may be formed from copper (Cu), gold (Au), aluminum (Al), nickel (Ni), molybdenum (Mo), or titanium (Ti), or an alloy containing one or more of these metals.

The uncovered surfaces of the first electrode pads 3a, the second electrode pads 3b, the third electrode pads 3c, the fourth electrode pads 3d, the external-circuit connecting pads, the inner wires, and the feedthrough conductors are plated. This structure covers the uncovered surfaces of the first electrode pads 3a, the second electrode pads 3b, the third electrode pads 3c, the fourth electrode pads 3d, the external-circuit connecting pads, the inner wires, and the feedthrough conductors and protects the surfaces against oxidation. Also, this structure can electrically connect the first electrode pads 3a, the second electrode pads 3b, the third electrode pads 3c, and the fourth electrode pads 3d to the first image sensor 10a or the second image sensor 10b in an appropriate manner through first bonds 13, such as bonding wires. This structure also improves the bonding strength. The plating layer may be, for example, a Ni plating layer with a thickness of 0.5 to 10 µm, or the Ni plating layer may further be coated with a gold (Au) plating layer with a thickness of 0.5 to 3 µm.

The substrate 2 in the image sensor mounting base 1 has, on its upper surface, the recess 2c between the third electrode pads 3c and the fourth electrode pads 3d. The second mount area 4b partially extends on the bottom of the recess 2c. The substrate 2 with the recess 2c may include a frame 2a with an opening and a base 2b bonded to or integrally sintered with the lower surface of the frame 2a as shown in FIGS. 1A to 2B.

The recess 2c may be, for example, an opening formed in the insulating layers of the substrate 2. As shown in FIGS. 1A to 4B, the recess 2c may have a step at the upper surface, which can be formed by openings of different sizes in the insulating layers, or the recess 2c may be an opening uniformly formed in the insulating layers as shown in FIGS. 5A to 6B. The recess 2c may accommodate, either inside or on its bottom, the third electrode pads 3c and the fourth electrode pads 3d. The third electrode pads 3c and the fourth electrode pads 3d may be located in an area of the step formed by the openings of different sizes in the insulating layers defining the recess 2c, or on the upper surface of the substrate 2.

In the present embodiment, the substrate 2 has, on its upper surface, the recess 2c between the third electrode pads 3c and the fourth electrode pads 3d. The second mount area 4b partially extends on the bottom of the recess 2c. This allows the first image sensor 10a and the second image sensor 10b to have different distances from the respective lenses when the first image sensor 10a and the second image sensor 10b have different intended numbers of pixels. The second image sensor 10b mounted in the recess 2c can thus have a larger distance from its upper surface to a second lens barrel 19b than the first image sensor 10a. In this structure, the second lens barrel 19b for the second image sensor 10b can include more lenses, have a larger thickness, or include an additional mechanism without greatly increasing the height. This minimizes the thickness of each lens barrel 19, and reduces the height of the imaging module 31.

The image sensors 10 (the first image sensor 10a and the second image sensor 10b) may have different levels of heat dissipation to be satisfied. Thus, the image sensor mounting base 1 is expected to at least partially improve heat dissipation. The image sensor mounting base 1 may also be intended to improve electrical characteristics as well as heat dissipation.

In contrast, the substrate 2 has, on its upper surface, the recess 2c between the third electrode pads 3c and the fourth electrode pads 3d in the present embodiment. The second mount area 4b partially extends on the bottom of the recess 2c. This allows the second image sensor 10b to have a smaller direct distance from its lower surface to the lower surface of the substrate 2 than the first image sensor 10a. Thus, when multiple (two) image sensors 10 are used, the second image sensor 10b, which generates more heat, may be mounted in the recess 2c, allowing the second mount area 4b to release more heat than the first mount area 4a when the imaging module 31 is installed in contact with an external device. The imaging module 31 improves heat dissipation. This structure thus reduces noise appearing in an image due to heat generated from the imaging module 31 in use.

The first mount area 4a has a greater height than the second mount area 4b. This structure allows use of more inner wires connectable to a power source or to a ground, thus improving the electrical characteristics of the image sensor mounting base 1.

With the above two advantageous effects, the image sensor mounting base 1 according to the embodiment of the present invention including multiple image sensors 10 can partially improve heat dissipation, and maintain and improve electrical characteristics. This reduces, for example, noise appearing in an image captured by the imaging module 31.

Although the functionality and intended characteristics of the first image sensor 10a and the second image sensor 10b are not specified in the present embodiment, the second image sensor 10b may have more advanced functionality or more functions and thus generate more heat than the first image sensor 10a. The structure according to the present embodiment may accommodate such sensors generating more heat, and thus produce the advantageous effects of the present invention.

The third electrode pads 3c and the fourth electrode pads 3d in the image sensor mounting base 1 may be located on the step of the recess 2c as shown in FIGS. 1A to 4B, or on the upper surface of the substrate 2 as shown in FIGS. 5A to 6B, or on the bottom of the recess 2c. The third electrode pads 3c and the fourth electrode pads 3d located on the step of the recess 2c as shown in FIGS. 1A to 4B can reduce the height from the upper surface of the substrate 2 to the lid 12. This structure reduces the amount of second bonds 14 to be used, and also allows the lid 12 to have a stable height. The third electrode pads 3c and the fourth electrode pads 3d are located on the upper surface of the substrate 2 as shown in FIGS. 5A to 6B. This structure reduces the amount of first bonds 13 to be used, and thus reduces the cost. The third electrode pads 3c and the fourth electrode pads 3d located on the bottom of the recess 2c can thus be near the second image sensor 10b. Thus, the substrate 2 can be downsized.

Structure of Imaging Device

The imaging device 21 has the structure shown in, for example, FIGS. 1A, 1B, 2A, 2B, 5A, and 5B. The imaging device 21 includes the image sensor mounting base 1, the first image sensor 10a mounted on the first mount area 4a on the image sensor mounting base 1, and the second image sensor 10b mounted on the second mount area 4b on the image sensor mounting base 1. The first image sensor 10a and the second image sensor 10b may be, for example, complementary metal oxide semiconductor (CMOS) devices or charge coupled devices (CCDs).

The imaging device 21 may include the lid 12 bonded to the image sensor mounting base 1 to cover the first image sensor 10a and the second image sensor 10b. The image sensor mounting base 1 may include, on its upper surface, a frame supporting the lid 12 and surrounding the image sensor 10. The frame may be formed from the same material as for the substrate 2, or from a different material.

For example, the frame and the substrate 2 may be formed from the same electrical insulating ceramic material. In this case, the frame and the substrate 2 are sintered together to achieve increased bonding strength between them.

For the frame and the substrate 2 formed from different materials, the frame may be formed from the same material as the second bonds 14, which bond the lid 12 to the substrate 2. In this case, the second bonds 14 may be thick to achieve sufficient bonding strength and to serve as the frame (support for the lid 12). Examples of the second bonds 14 include a thermosetting resin and a brazing material formed from glass with a low melting point or a metal component. The frame and the lid 12 may be formed from the same material. In this case, the frame and the lid 12 may be formed as one piece.

The lid 12 is, for example, a flat plate. The lid 12 is formed from, for example, a highly transparent material such as a glass material or an infrared ray cut filter (IR cut filter) when the image sensor 10 is a CMOS device or a CCD. The lid 12 located above the upper surface of the first image sensor 10a may be at a different position in the height direction from the lid 12 located above the upper surface of the second image sensor 10b as shown in FIGS. 2B to 3B, or at the same height as shown in FIGS. 4B to 6B.

The imaging device 21 includes the image sensor mounting base 1 as shown in FIGS. 1A, 1B, 2A, 2B, 5A, and 5B. This structure enables the first image sensor 10a and the second image sensor 10b to have different intended numbers of pixels or different intended functionality (characteristics) while improving heat dissipation partially and maintaining and improving the electrical characteristics. This reduces, for example, noise appearing in an image captured by the imaging module 31.

The first image sensor 10a and the second image sensor 10b may be bonded to the substrate 2 with the second bonds having high elasticity, such as a resin. The second bonds having high elasticity can absorb external stress applied from outside the imaging device 21, thus reducing the likelihood that the first image sensor 10a or the second image sensor 10b cracks or breaks.

Structure of Imaging Module

The imaging module 31 including the image sensor mounting base 1 has the structure shown in, for example, FIGS. 3A, 3B, 4A, 4B, 6A, and 6B. The imaging module 31 includes the imaging device 21, a first lens barrel 19a surrounding the first mount area 4a, which is bonded to the upper surface of the imaging device 21, and the second lens barrel 19b surrounding the second mount area 4b, which is bonded to the upper surface of the imaging device 21.

The imaging module 31 with the structure shown in, for example, FIGS. 3A, 3B, 4A, 4B, 6A, and 6B includes the first lens barrel 19a surrounding the first mount area 4a, which is bonded to the upper surface of the imaging device 21, and the second lens barrel 19b surrounding the second mount area 4b, which is bonded to the upper surface of the imaging device 21.

The imaging module 31 having the first lens barrel 19a and the second lens barrel 19b improves airtightness. The first lens barrel 19a or the second lens barrel 19b may include a barrel formed from, for example, a resin or a metal material, and at least one concave lens or convex lens formed from, for example, a resin, liquid, glass, or crystal. The first lens barrel 19a or the second lens barrel 19b may include, for example, a drive for vertical or horizontal driving, and may be electrically connected to the substrate 2.

The first lens barrel 19a or the second lens barrel 19b may have an opening in at least one of four sides as viewed from above. The opening in the first lens barrel 19a or the second lens barrel 19b may receive an external circuit to be electrically connected to the substrate 2. After the external circuit is electrically connected to the substrate 2, the opening in the first lens barrel 19a or the second lens barrel 19b may be sealed with a sealant, such as a resin, to hermetically seal the inside of the imaging module 31.

The first lens barrel 19a and the second lens barrel 19b are fastened to surround the first mount area 4a and the second mount area 4b with, for example, a thermosetting resin or a brazing material such as solder. The material for fastening the first lens barrel 19a to the first mount area 4a and the second lens barrel 19b to the second mount area 4b may be either conductive or non-conductive. A conductive fastening material used in a fastening area 2c can receive external power or signals through the substrate 2 when the first lens barrel 19a or the second lens barrel 19b includes a drive for vertical or horizontal driving.

Figure 3A:
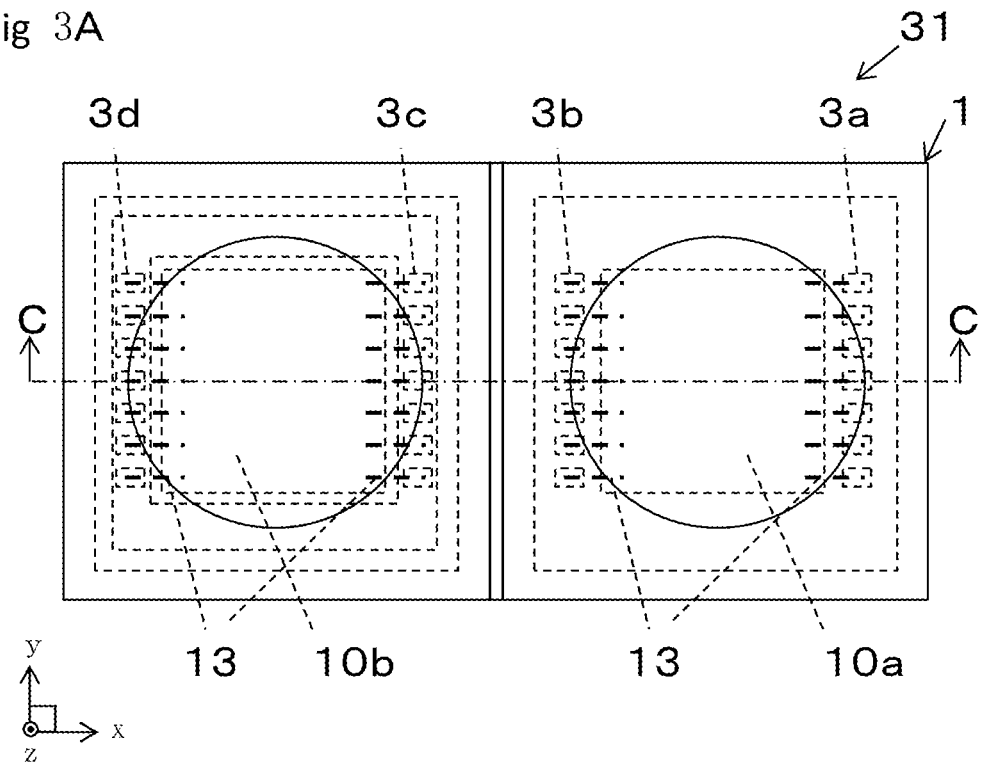
FIG. 3A is an external top view of an imaging module including the image sensor mounting base according to the first embodiment of the present invention.
Figure 3B:
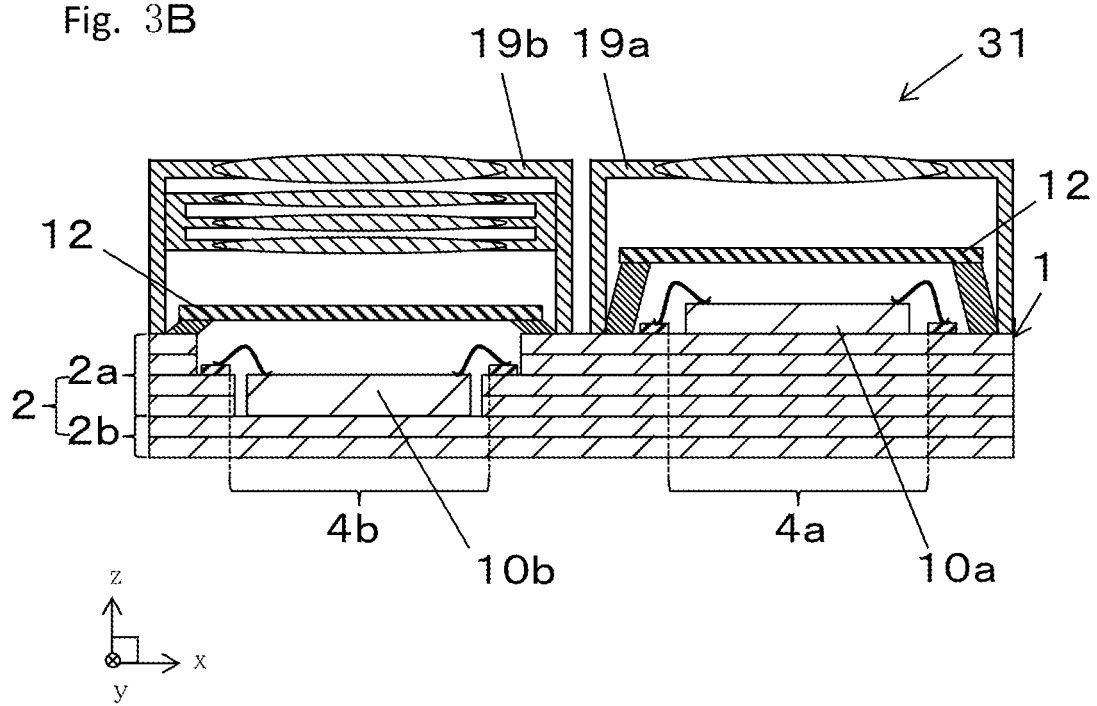
FIG. 3B is a cross-sectional view taken along line C-C in FIG. 3A.
Figure 4A:
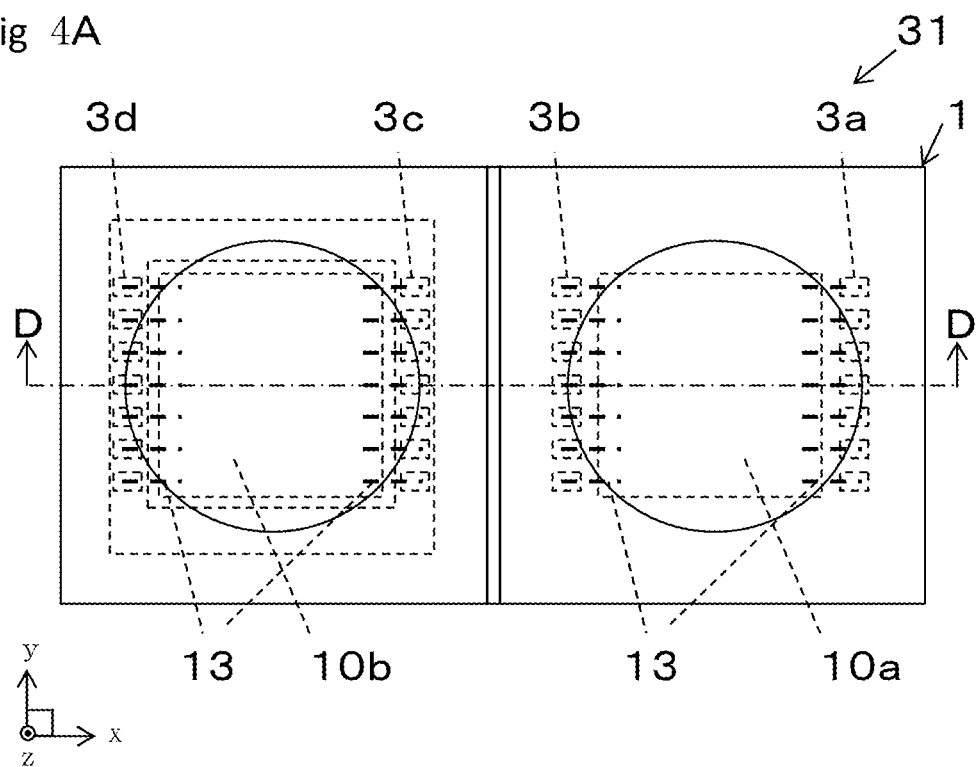
FIG. 4A is an external top view of an imaging module including the image sensor mounting base according to the first embodiment of the present invention.
Figure 4B:
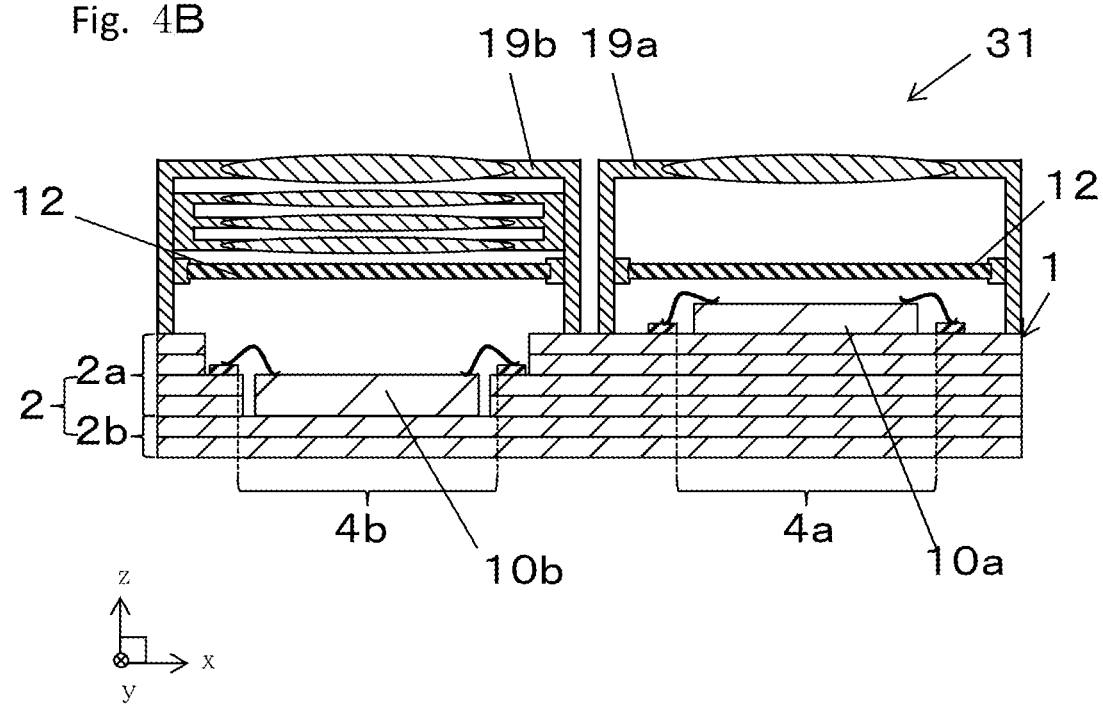
FIG. 4B is a cross-sectional view taken along line D-D in FIG. 4A.
Figure 5A:
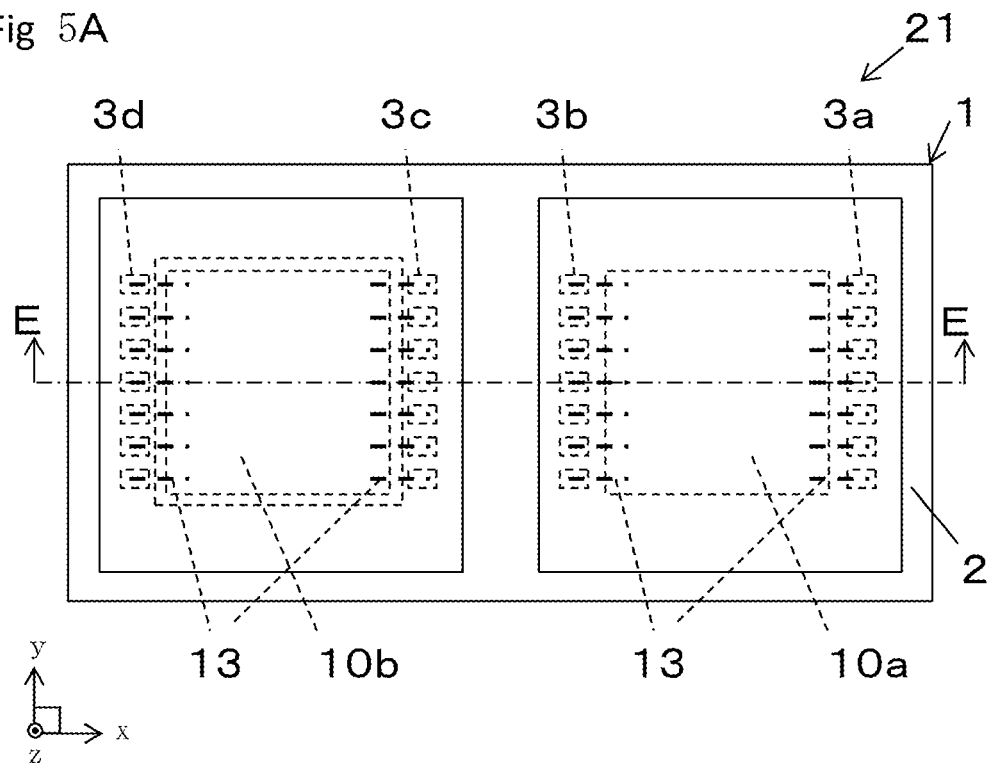
FIG. 5A is an external top view of an imaging device including the image sensor mounting base according to the first embodiment of the present invention.
Figure 5B:
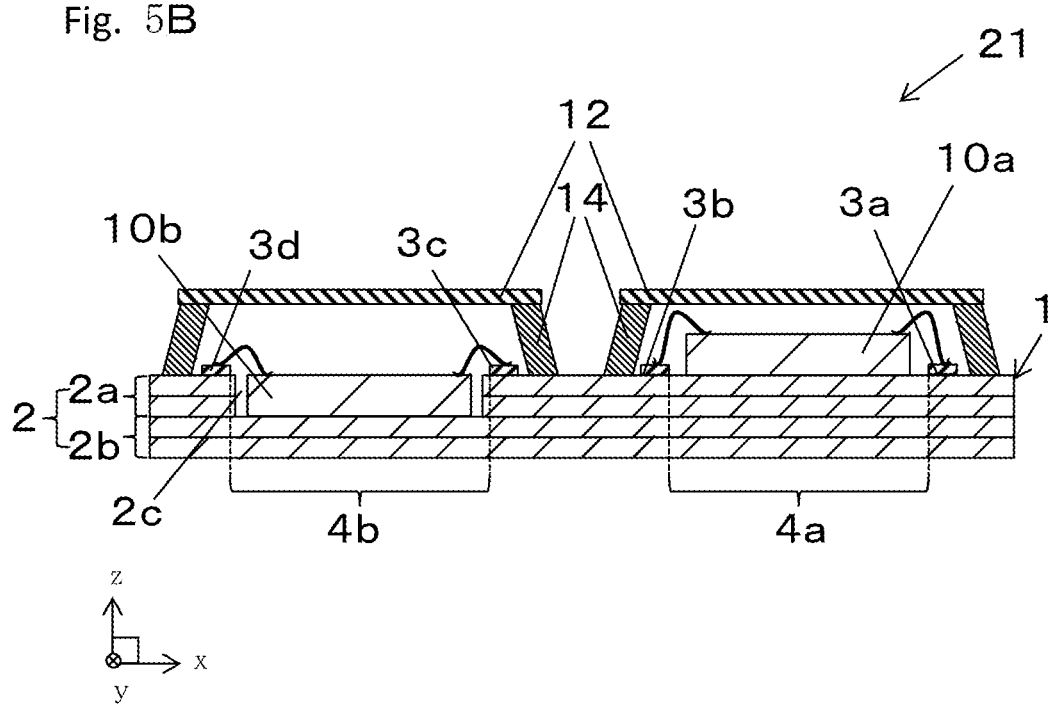
FIG. 5B is a cross-sectional view taken along line E-E in FIG. 5A.
Figure 6A:
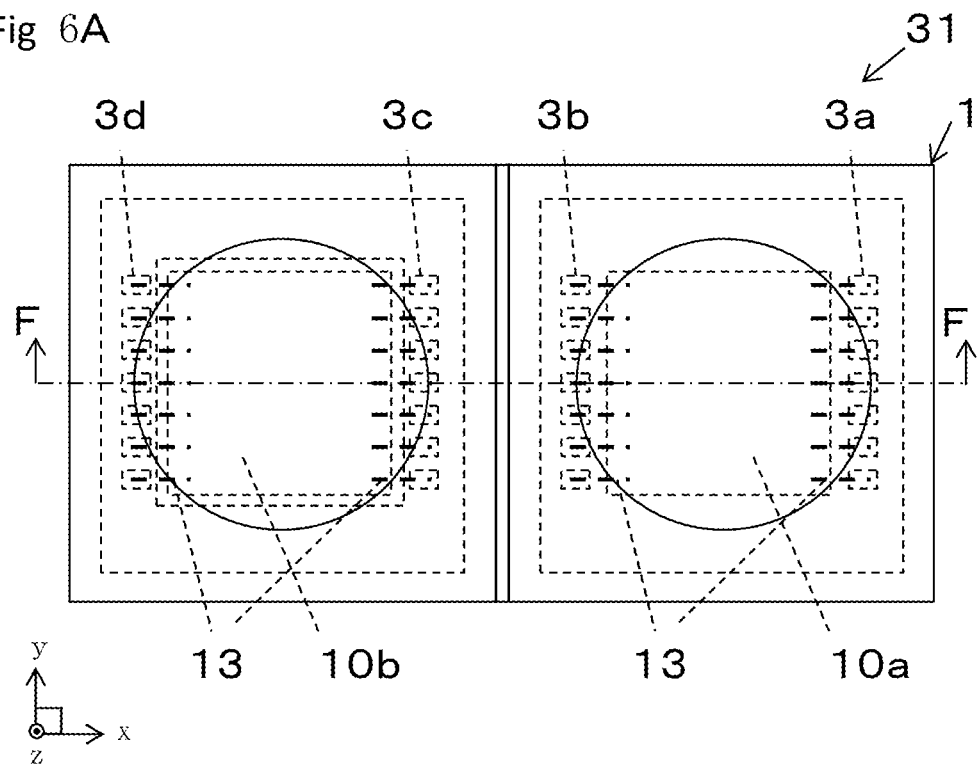
FIG. 6A is an external top view of an imaging module including the image sensor mounting base according to the first embodiment of the present invention.
Figure 6B:
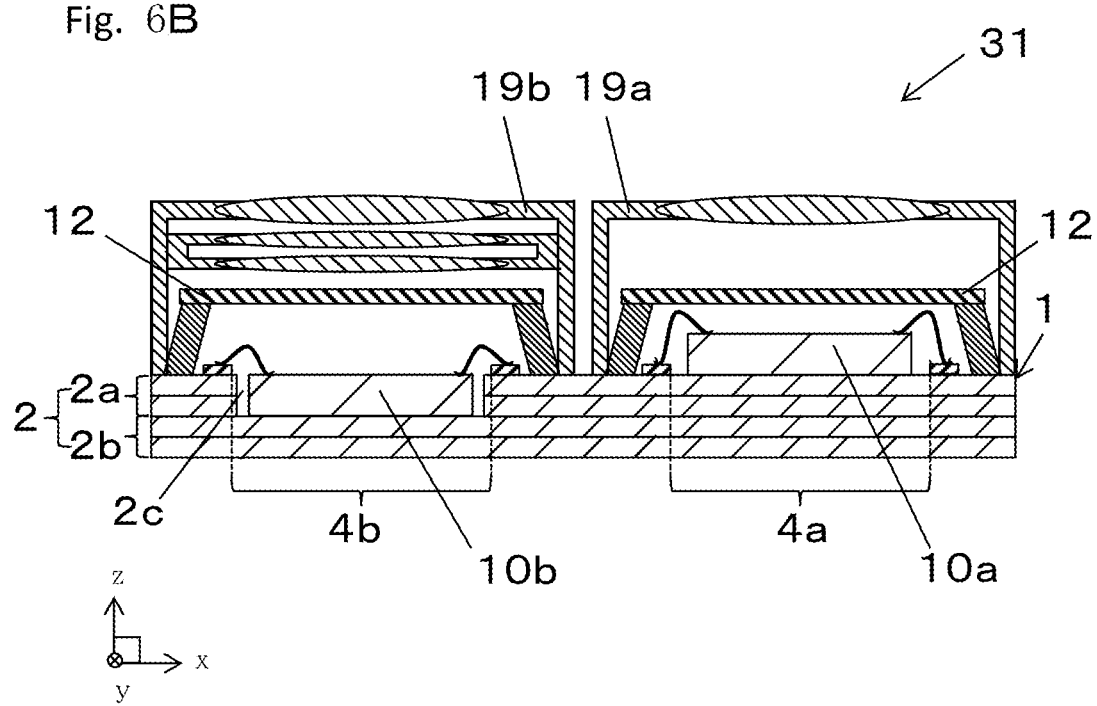
FIG. 6B is a cross-sectional view taken along line F-F in FIG. 6A.

The imaging module 31 may include the lid 12 connected to the substrate 2 as shown in FIGS. 3A and 3B, or may have the lid 12 incorporated in the first lens barrel 19a or the second lens barrel 19b as shown in FIGS. 4A and 4B. As shown in FIGS. 3A and 3B, the lid 12 connected to the substrate 2 hermetically seals the area defined by the lid 12, the first image sensor 10a or the second image sensor 10b, and the substrate 2 in a more reliable manner, thus reducing dust or other matter entering the area. As shown in FIGS. 4A and 4B, the lid 12 may be incorporated in the first lens barrel 19a or the second lens barrel 19b. This structure eliminates thermal history in the process of bonding the lid 12 to the substrate 2, thus reducing stress on the first image sensor 10a or the second image sensor 10b resulting from thermal history.

Although the first lens barrel 19a and the second lens barrel 19b can have different structures, components, performance, or mechanisms, the upper surfaces of the first lens barrel 19a and the second lens barrel 19b mounted on the image sensor mounting base 1 may be at the same height position as viewed in cross-section to reduce the height of the imaging module 31. This structure also facilitates adjustment in the height direction for the module attached to an external device, thus further reducing the height of the external device including the imaging module 31. The upper surfaces of both the first lens barrel 19a and the second lens barrel 19b in contact with an external device can receive stress applied from the external device when, for example, the external device falls. However, the larger area to receive stress relaxes stress concentration. This structure thus reduces the likelihood that the image sensor mounting base 1 cracks or breaks under stress applied from the first lens barrel 19*a* and the second lens barrel 19*b*.

The imaging module 31 including the imaging device 21 with the structure shown in, for example, FIGS. 1A, 1B, 2A, 2B, 5A, and 5B can provide a larger distance from the second image sensor 10*b* to the second lens barrel 19*b*. This structure enables the second lens barrel 19*b* surrounding the second mount area 4*b* to have more drives, a thicker lens, or more lenses, thus improving the performance and reducing the height of the imaging module 31.

Method for Manufacturing Image Sensor Mounting Base, Imaging Device, and Imaging Module An example method for manufacturing the image sensor mounting base 1, the imaging device 21, and the imaging module 31 according to the present embodiment will now be described. The manufacturing method described below uses a multi-piece wiring substrate to fabricate the substrate 2.

(1) A ceramic green sheet that is to be the substrate 2 is prepared first. To obtain the substrate 2 formed from, for example, sintered aluminum oxide ($Al_2O_3$), powders, such as silica ($SiO_2$), magnesia (MgO), or calcium oxide (CaO), are added as sintering aids to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2 formed from, for example, a resin, may be formed using a mold for molding into a predetermined shape by transfer molding or injection molding. The substrate 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2.

(2) A metal paste is then applied or placed, by screen printing or other techniques, into the areas to be the first electrode pads 3*a*, the second electrode pads 3*b*, the third electrode pads 3*c*, the fourth electrode pads 3*d*, the external-circuit connecting pads, the inner wires, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the substrate 2.

(3) The green sheet is then processed using, for example, a die. An opening is formed through the ceramic green sheets to be the substrate 2 at a predetermined position to be the recess 2*c*. The opening formation process may be followed by stacking multiple ceramic green sheets on one another. An opening may then be formed through the green sheets stacked on one another. In some embodiments, an opening may be formed in each of separate multiple ceramic green sheets, and the ceramic green sheets each having the opening may then be stacked on one another in the process described below.

(4) The ceramic green sheets to be the insulating layers are then stacked and pressed. This yields the ceramic green sheet laminate, which is to be the substrate 2.

(5) This ceramic green sheet laminate is then fired at about 1,500 to 1,800° C. to obtain a multi-piece wiring substrate including an array of substrates 2. In this process, the metal paste described above is fired together with the ceramic green sheets to be the substrate 2 to form the first electrode pads 3*a*, the second electrode pads 3*b*, the third electrode pads 3*c*, the fourth electrode pads 3*d*, the external-circuit connecting pads, the inner wires, and the feedthrough conductors.

(6) The first electrode pads 3*a*, the second electrode pads 3*b*, the third electrode pads 3*c*, the fourth electrode pads 3*d*, the external-circuit connecting pads, the inner wires, and the feedthrough conductors, which are uncovered on the substrate 2, may be plated by electroplating or electroless plating. The plating layer may be, for example, a Ni plating layer with a thickness of 0.5 to 10 μm, or the Ni plating layer may further be coated with a gold (Au) plating layer with a thickness of 0.5 to 3 μm.

(7) The multi-piece wiring substrate resulting from the firing process is then cut into a plurality of substrates 2. In this cutting process, separation grooves may be formed along the outer edge of each of the substrates 2, and the multi-piece wiring substrate may be split along the separation grooves into the plurality of substrates 2 or cut along the outer edge of each of the substrates 2 by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer.

(8) To fabricate the imaging device 21, the first image sensor 10*a* is mounted on the first mount area 4*a* in the substrate 2, and the second image sensor 10*b* is mounted on the second mount area 4*b* in the substrate 2. The first image sensor 10*a* and the second image sensor 10*b* are electrically bonded to the substrate 2 by, for example, wire bonding. The first image sensor 10*a*, the second image sensor 10*b*, or the substrate 2 may include second bonds for fixing the sensors to the substrate 2. The lid 12 may be bonded with the second bonds 14 after the first image sensor 10*a* and the second image sensor 10*b* are mounted on the substrate 2.

(9) On the upper surface of the substrate 2, the first lens barrel 19*a* is mounted to surround the first mount area 4*a*, and the second lens barrel 19*b* is mounted to surround the second mount area 4*b*. The first lens barrel 19*a* and the second lens barrel 19*b* are bonded to the substrate 2 with a bond such as solder, a conductive resin, or a nonconductive resin.

The image sensor mounting base 1, the imaging device 21, and the imaging module 31 are manufactured in the manner described above. Through the processes (1) to (9), the imaging device 21 and the imaging module 31 are obtained. The processes (1) to (9) above may be performed in any order.

Second Embodiment

An imaging module 31 according to a second embodiment of the present invention will now be described with reference to FIGS. 7A to 8B. The imaging module 31 according to the present embodiment differs from the imaging module 31 according to the first embodiment in the shape of a recess 2*c* in cross-section.

Figure 7A:
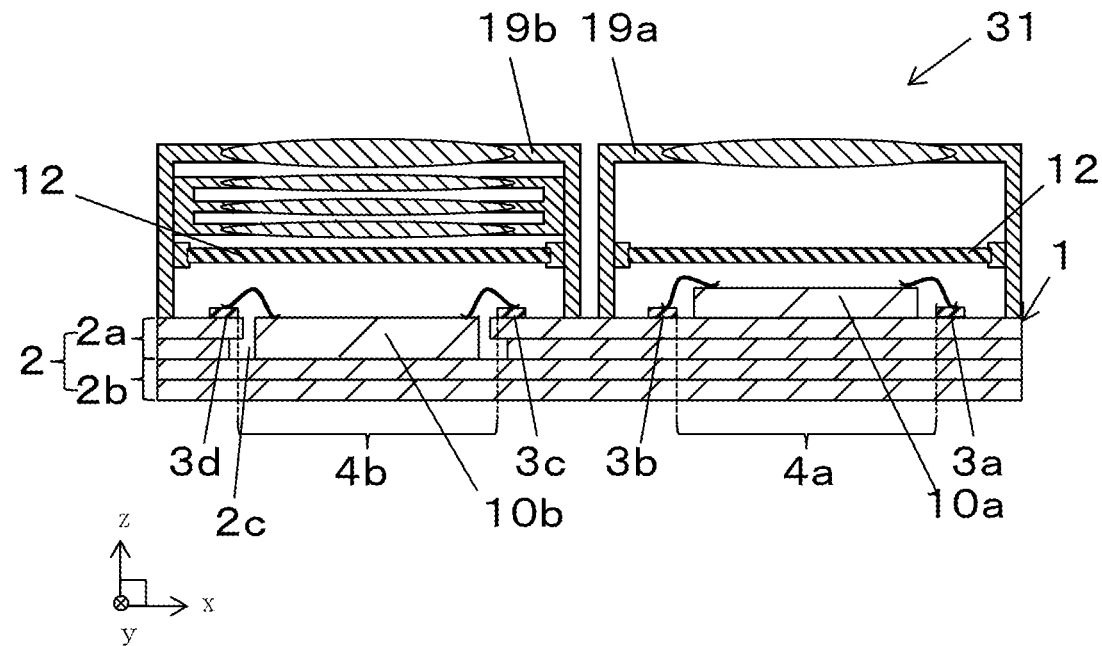
FIG. 7A is an external cross-sectional view of an imaging module including an image sensor mounting base according to a second embodiment of the present invention.

FIG. 7A shows an imaging module according to one embodiment in which an uppermost layer defining the recess 2c has an inwardly protruding end. The image sensor mounting base 1 according to the present embodiment includes the substrate 2 including multiple layers. The recess 2c in the substrate 2 has an end protruding more inwardly in the first layer nearest the upper surface than in the second upper layer second nearest the upper surface.

In the present embodiment, light may be incident through the upper surface of the imaging module 31 and reflect on the bottom and the sides of the recess 2c. The recess 2c has an inwardly protruding end in the first layer nearest the upper surface to reduce the likelihood that the light-receiving surface of the second image sensor 10b receives the reflected light. This reduces noise appearing in an image captured by the imaging module 31 due to diffuse reflection of light, and also reduces the height of the imaging module 31, responding to one main issue in the embodiment of the present invention. The recess is defined by two layers in the example shown in FIG. 7A. In some embodiments, the recess may be defined by three or more layers. The layers subsequent to the second layer defining the recess 2c may have sides flush with the sides of the second layer defining the recess 2c in cross-section, or may be located either inward or outward from the sides of the second layer defining the recess 2c. In particular, when no pads or other parts are located on the second layer or subsequent layers in the recess 2c, the second layer or subsequent layers may be located outward from the sides of the first layer to further reduce noise due to light reflection.

In the substrate 2 formed from, for example, an electrical insulating ceramic material, the inwardly protruding first layer may be a block (laminate) of multiple layers having aligned ends defining the end of the recess 2c. In this structure, the end of the first layer defining the recess 2c may be located at a position different from the ends of the second and subsequent layers defining the recess 2c by at least 15 μm to further enhance the advantageous effects of the present invention.

As shown in FIG. 7A, the first layer nearest the upper surface protrudes inwardly at the end of the recess 2c in the substrate 2 to reduce any dust or other matter entering the recess 2c in the imaging module 31 adhering to the upper surface of the second image sensor 10b. This reduces noise appearing in an image captured by the imaging module 31 due to dust.

One method for manufacturing the image sensor mounting base 1 with the structure shown in FIG. 7A will be described. For example, the substrate 2 formed from an electrical insulating ceramic material undergoes the process of forming an opening to be the recess 2c at a predetermined position in ceramic green sheets to be the substrate 2. An opening is formed in the ceramic green sheet of the first layer, and an opening larger than the opening in the first layer is then formed in the ceramic green sheet(s) to be the second or other subsequent layer(s). The ceramic green sheets are then stacked on one another and fired. The other processes are the same as described in the first embodiment.

In the substrate 2 formed from, for example, an electrical insulating ceramic material, the first layer defining the recess 2c nearer the upper surface protrudes inwardly at the end of the recess 2c as shown in FIG. 7A to reduce the likelihood that any misalignment causes the sides of the second and subsequent layers defining the recess 2c to protrude inwardly from the sides of the first layer defining the recess 2c. The recess 2c can have the surface area (dimensions) with at least a predetermined size as viewed from above. This structure reduces the likelihood that the second image sensor 10b cannot be mounted in the recess 2c in the process of mounting the second image sensor 10b.

Figure 7B:
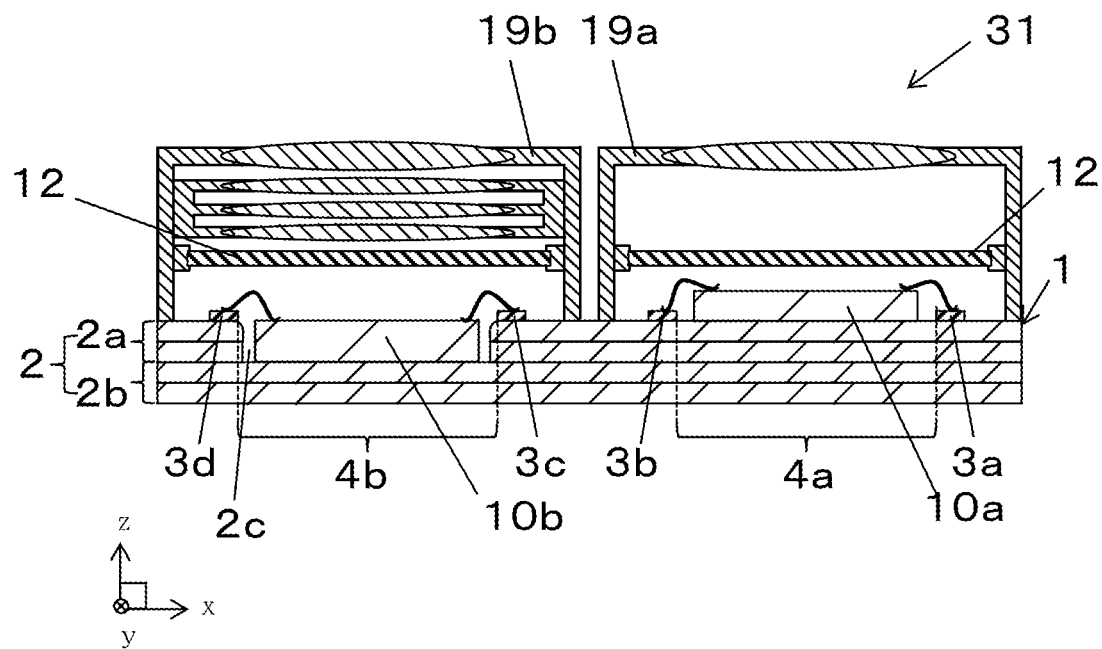
FIG. 7B is an external cross-sectional view of the imaging module including the image sensor mounting base according to the second embodiment of the present invention.

FIG. 7B shows an image sensor mounting base according to one embodiment in which a recess 2c has an end with a round edge. An image sensor mounting base 1 according to the present embodiment has the recess 2c with an end with a round edge in a substrate 2. The round edge of the end of the recess 2c in the substrate 2 reduces the likelihood that the second image sensor 10b cracks when coming in contact with the substrate 2. This also reduces dust from a chipped edge of the recess 2c in the substrate 2.

One method for manufacturing the image sensor mounting base 1 with the structure shown in FIG. 7B will be described. For example, the substrate 2 formed from an electrical insulating ceramic material undergoes the process of forming the recess 2c in the ceramic green sheets to be the substrate 2, in which the ceramic green sheets are pressed using a die with a round edge. For example, the substrate 2 formed from an electrical insulating ceramic material undergoes the process of forming the recess 2c in the ceramic green sheets to be the substrate 2 using a die with an opening at the position corresponding to the recess 2c, and then the process of stacking the ceramic green sheets on one another and pressing them, followed by an additional process of pressing the laminate using a die with a round edge. The opening formation process may use a lower die larger than an upper punch for forming an opening to be the recess 2c at a predetermined position in the ceramic green sheets, which are to be the substrate 2. The other processes are the same as described in the first embodiment.

Figure 8A:
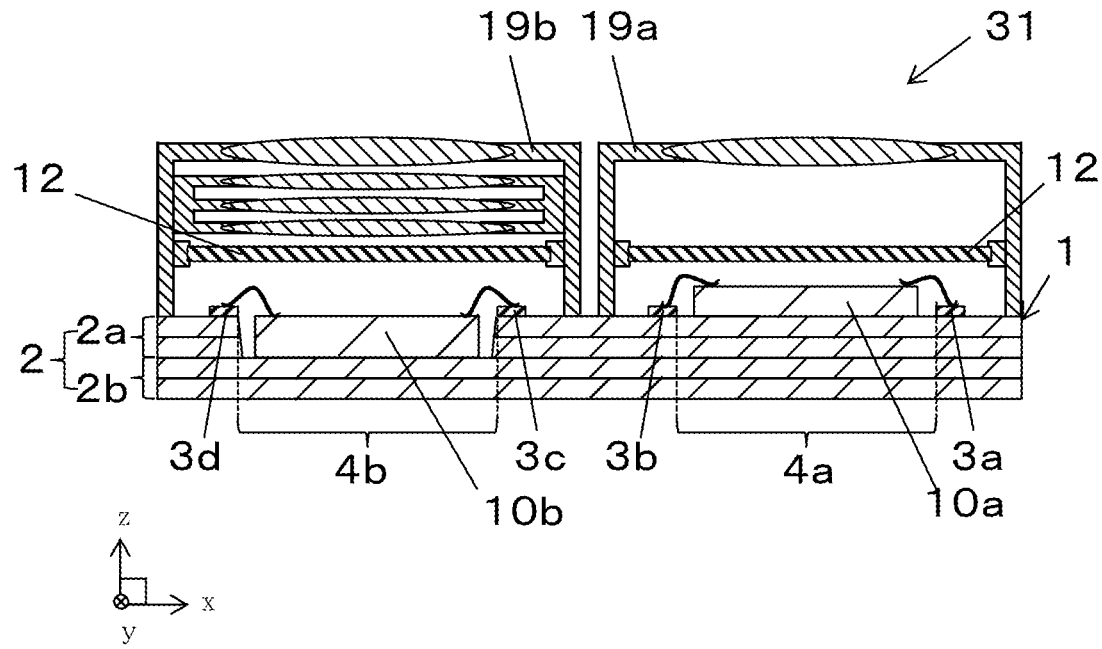
FIG. 8A is an external cross-sectional view of an imaging module including the image sensor mounting base according to the second embodiment of the present invention.
Figure 8B:
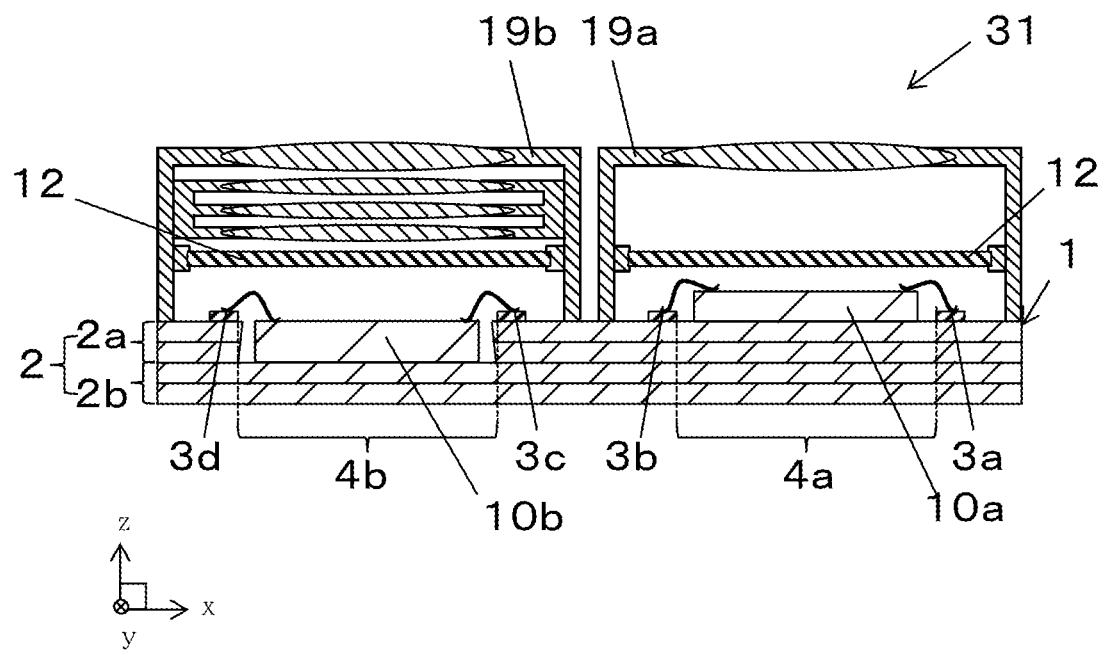
FIG. 8B is an external cross-sectional view of the imaging module including the image sensor mounting base according to the second embodiment of the present invention.

FIG. 8A shows an imaging module according to one embodiment in which the recess 2c has walls with their areas decreasing from the upper surface toward the lower surface. FIG. 8B shows an imaging module according to one embodiment in which a recess 2c has walls with their areas increasing from the upper surface toward the lower surface.

The image sensor mounting base 1 according to the present embodiment includes the substrate 2 with the recess 2c having side walls inclined from their upper ends toward the lower ends. The inclined side walls of the recess 2c reduce the likelihood that light incident through the upper surface is reflected on the side walls of the recess 2c and reaches the light-receiving surface of the second image sensor 10b.

One method for manufacturing the image sensor mounting base 1 with the structure shown in FIG. 8A or 8B will be described. For example, the substrate 2 formed from an electrical insulating ceramic material undergoes the process of forming the recess 2c in the ceramic green sheets to be the substrate 2, followed by an additional process of pressing the ceramic green sheets using a die to form the inclined side walls. For example, the structure shown in FIG. 8A can be obtained by pressing the upper surface of the substrate 2, whereas the structure shown in FIG. 8B can be obtained by pressing the lower surface of the substrate 2.

The image sensor mounting base 1 with the structure shown in either FIG. 8A or 8B has the recess 2c in the substrate 2 that can be prepared with the same method as in FIGS. 7A and 7B.

The image sensor mounting base 1 with the structure shown in FIG. 8A may be formed through the opening formation process using a lower die larger than an upper punch for forming an opening to be the recess 2c at a predetermined position in the ceramic green sheets, which are to be the substrate 2. The ceramic green sheets undergo punching on their side corresponding to the upper surface of the substrate 2.

The image sensor mounting base 1 with the structure shown in FIG. 8B may be formed through the opening formation process using a lower die larger than an upper punch for forming an opening to be the recess 2c at a predetermined position in the ceramic green sheets, which are to be the substrate 2. The ceramic green sheets undergo punching on their side corresponding to the lower surface of the substrate 2.

The other processes are the same as described in the first embodiment.

Third Embodiment

Figure 9A:
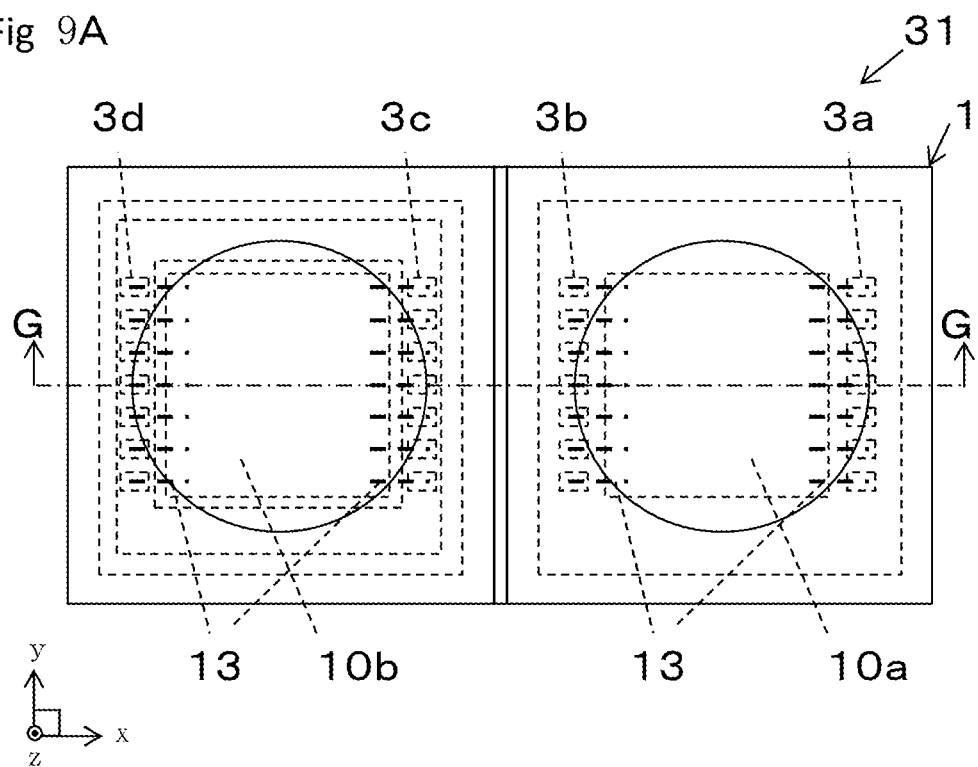
FIG. 9A is an external top view of an imaging module including an image sensor mounting base according to a third embodiment of the present invention.
Figure 9B:
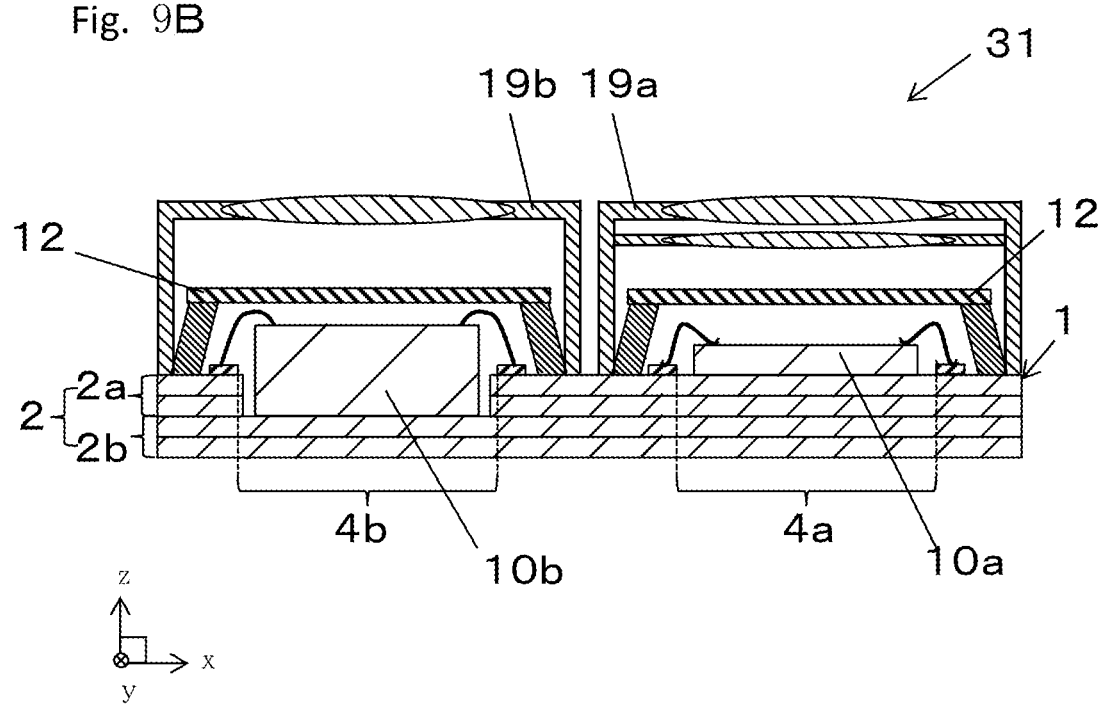
FIG. 9B is a cross-sectional view taken along line G-G in FIG. 9A.

An imaging module 31 according to a third embodiment of the present invention will now be described with reference to FIGS. 9A and 9B. The imaging module 31 according to the present embodiment differs from the imaging module 31 according to the first embodiment in the dimensions of the first image sensor 10a and the second image sensor 10b.

The imaging device 21 according to the present embodiment includes the second image sensor 10b with a greater thickness than the first image sensor 10a. More specifically, the second image sensor 10b has a greater thickness than the first image sensor 10a and is accommodated in the recess 2c in the substrate 2. The second image sensor 10b accommodated in the recess 2c allows the second image sensor 10b to have its upper surface at a level lower by the height of the recess 2c. This allows the first lens barrel 19a and the second lens barrel 19b to be aligned with each other at lower positions. This structure reduces the height of the imaging module 31.

Fourth Embodiment

An image sensor mounting base 1, an imaging device 21, and an imaging module 31 according to a fourth embodiment of the present invention will now be described with reference to FIGS. 10A, 10B, 11A, and 11B. The image sensor mounting base 1, the imaging device 21, and the imaging module 31 according to the present embodiment differ from the imaging module 31 according to the first embodiment in that a substrate 2 includes a metal substrate as one of its parts.

Figure 10A:
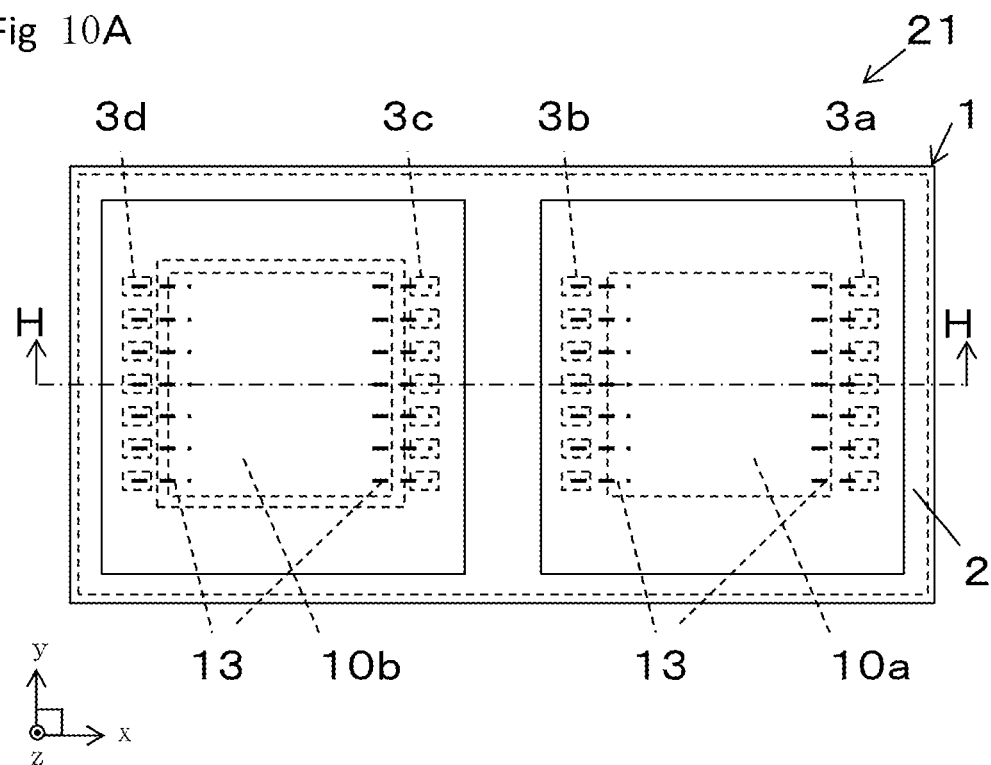
FIG. 10A is an external top view of an image sensor mounting base and an imaging device according to a fourth embodiment of the present invention.
Figure 10B:
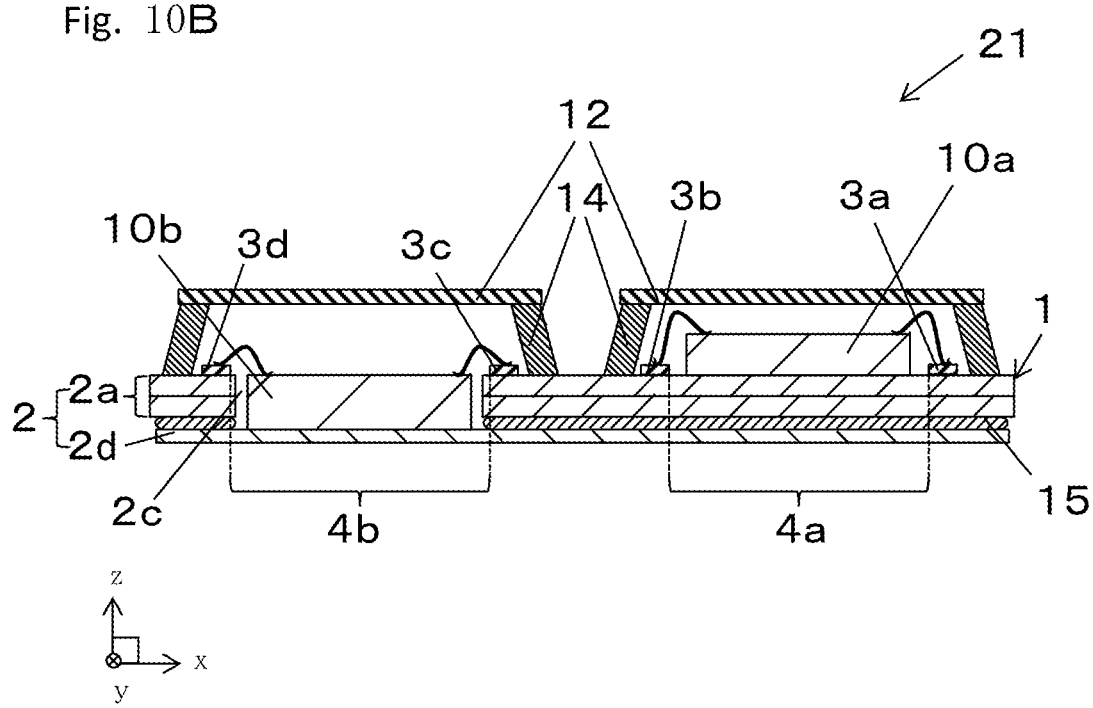
FIG. 10B is a cross-sectional view taken along line H-H in FIG. 10A.
Figure 11A:
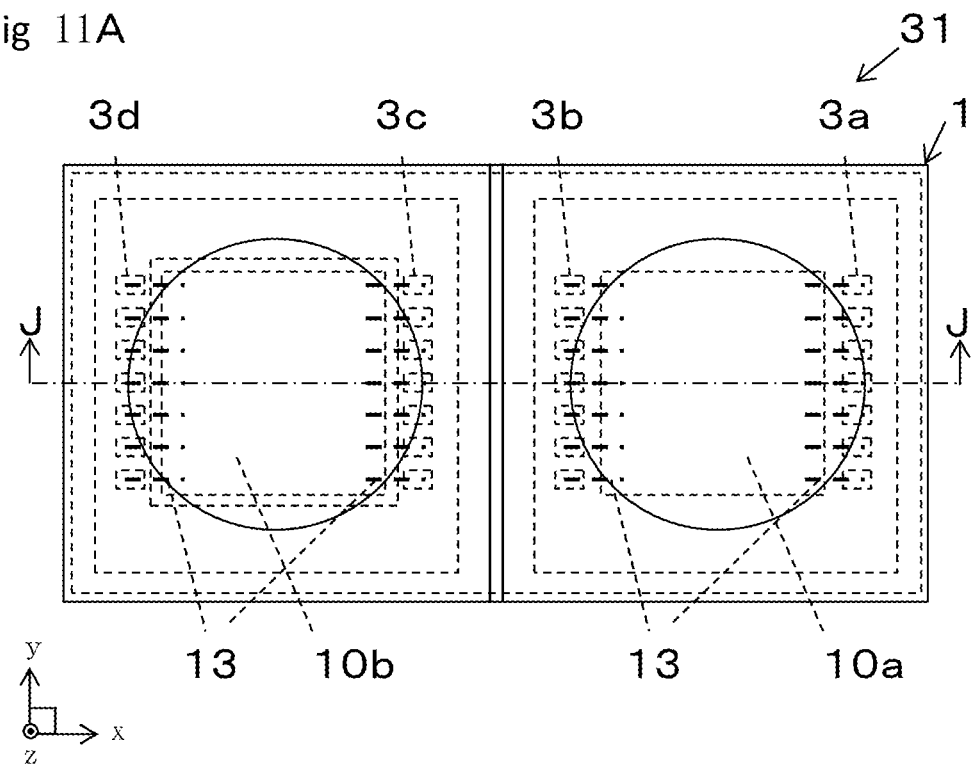
FIG. 11A is an external top view of an imaging module including an image sensor mounting base according to the fourth embodiment of the present invention.
Figure 11B:
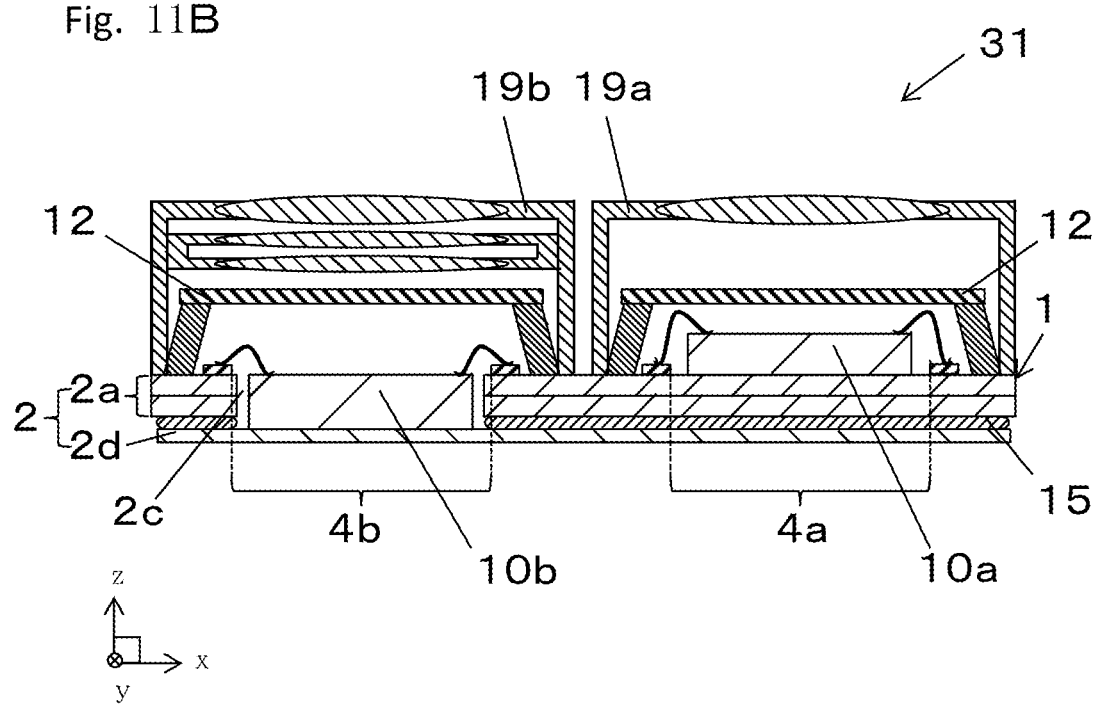
FIG. 11B is a cross-sectional view taken along line J-J in FIG. 11A.

FIGS. 10A and 10B each show an image sensor mounting base 1 and an imaging device 21 according to one embodiment in which a lowermost layer in a substrate 2 is a metal substrate. FIGS. 11A and 11B each show an imaging module 31 according to one embodiment in which a lowermost layer in a substrate 2 is a metal substrate.

The substrate 2 in the image sensor mounting base 1 according to the present embodiment includes multiple layers. The lowermost layer of the substrate 2 is a metal substrate 2d. Hereafter, a frame 2a is a portion having an opening defined by the sides of the recess 2c in the substrate 2 including multiple layers, and the metal substrate 2d is a metal substrate. The substrate 2 including multiple layers may include two layers, that is, the frame 2a and the metal substrate 2d. The substrate 2 including multiple layers may thus be the substrate 2 including the frame 2a formed as a single layer such as a thin-film substrate and the metal substrate 2d, and may be the substrate including the frame 2a formed by injection or other molding and the metal substrate 2d.

A metal material typically has higher thermal conductivity and higher ductility than an inorganic material or an organic material. Thus, a layer of a metal material can be thinner. In the imaging module 31 coming in contact with an external device, the image sensor 10 is to be located nearer the external device to improve heat dissipation. In the present embodiment, the substrate 2 includes the metal substrate 2d as the lowermost layer. When the imaging module 31 operates and releases heat generated in the second image sensor 10b, this structure improves thermal conductivity for heat dissipation and also shortens the distance from the second image sensor 10b to an external device. This structure improves heat dissipation partly (in the second mount area 4b), and improves electrical characteristics. This reduces, for example, noise appearing in an image captured by the imaging module 31.

As the image sensor mounting base 1 becomes thinner in response to a recent trend, the recess 2c may have a thinner layer as its bottom. The recess 2c in the image sensor mounting base 1 may thus have the metal substrate 2d as its bottom. The metal substrate 2d as the bottom of the recess 2c in the image sensor mounting base 1 has high ductility and is less likely to crack or break under stress applied from the second lens barrel 19b. This structure reduces the likelihood that the imaging device 21 or the imaging module 31 operates abnormally.

The image sensor mounting base 1 may tend to be upsized in one direction (X-direction in the present embodiment) for accommodating multiple image sensors 10. If an external device onto which an imaging module is mounted falls, the imaging module or the image sensor mounting base can undergo distortion under vibrations while falling. In response to this, the image sensor mounting base 1 according to the present embodiment uses the metal substrate 2d as the bottom of the recess 2c to reduce distortion in the image sensor mounting base 1, and reduces cracks and breaks in the image sensor mounting base 1.

The metal substrate 2d is formed from, for example, a material with high thermal conductivity. The material having high thermal conductivity can dissipate, across the entire metal substrate 2d, heat generated during use of the image sensor 10 or heat applied for bonding the frame 2a and the metal substrate 2d together with the third bond 15. This material thus allows uniform curing of the third bond 15. This material can also release heat generated in the imaging device 21 outside.

Examples of the metal substrate 2d include stainless steel (SUS), an Fe—Ni—Co alloy, alloy 42, copper (Cu), and a copper alloy. When, for example, the frame 2a is formed from sintered aluminum oxide with a coefficient of thermal expansion of about $5 \times 10^{-6}/°$ C. to $10 \times 10^{-6}/°$ C., the metal substrate 2d may be formed from stainless steel (SUS 410 or SUS 304) with a coefficient of thermal expansion of about $10 \times 10^{-6}$ PC to $17 \times 10^{-6}/°$ C.

In this case, the frame 2a has a small difference in thermal contraction and expansion from the metal substrate 2d. This reduces stress applied between the frame 2a and the metal substrate 2d, and reduces deformation of the frame 2a or the metal substrate 2d. This reduces optical axis misalignment between the first lens barrel 19a and the second lens barrel 19b, which are fixed to the first image sensor 10a, the second image sensor 10b, and the frame 2a. The resultant images can be clearer. This structure also reduces cracks and breaks in the frame 2a.

The metal substrate 2d is formed from a non-magnetic material, and is thus prevented from being magnetized by the first image sensor 10a, the second image sensor 10b, or another electronic component mounted on the substrate 2. The metal substrate 2d is thus prevented from interfering with, for example, the operation of the first lens barrel 19a or the second lens barrel 19b, such as lens driving.

The metal substrate 2d has a side length of, for example, about 3 mm to 10 cm, in correspondence with the size of the frame 2a. The metal substrate 2d has a thickness of, for example, at least 0.05 mm.

The metal substrate 2d may have its outer edge inward from or at the overlapping position as, or outward (protruding) from the outer edge of the frame 2a as viewed from above. When the metal substrate 2d has its outer edge inward from or at the overlapping position as the outer edge of the frame 2a as viewed from above, the image sensor mounting base 1 can be downsized. When the metal substrate 2d has its outer edge outward from the outer edge of the frame 2a as viewed from above, the image sensor mounting base 1 may reduce stress applied on the sides of the of the frame 2a, and thus reduce cracks in the frame 2a caused by stress applied on the sides. When the metal substrate 2d has the outer edge outward from the outer edge of the frame 2a as viewed from above, one or both of the first lens barrel 19a and the second lens barrel 19b may be partially bonded to the metal substrate 2d. This allows stress applied from one or both of the first lens barrel 19a and the second lens barrel 19b to be released to the metal substrate 2d, and reduces cracks and breaks in the frame 2a.

The frame 2a and the metal substrate 2d may be bonded together with the third bond 15. Examples of the third bond 15 include a thermosetting resin and a brazing material. Examples of a thermosetting resin used as the material of the third bond 15 include a bisphenol A liquid epoxy resin. Examples of a brazing material used as the material of the third bond 15 include solder, lead, and glass.

The third bond 15 may be conductive. Examples of the conductive third bond 15 include silver epoxy, solder, an anisotropic conductive resin (an anisotropic conductive paste or ACP), and an anisotropic conductive film (ACF). The conductive third bond 15 can electrically connect the frame 2a to the metal substrate 2d. For example, the frame 2a is electrically connected to the metal substrate 2d with the same potential as a ground electrode. This allows the metal substrate 2d to function as a shield for protecting the image sensors 10 from external noise.

The image sensor mounting base 1 may include the third bond 15 formed from a resin material between the frame 2a and the metal substrate 2d. The third bond 15 formed from a resin material is typically softer than a brazing material including a metal material. The third bond 15 formed from a resin material reduces impact under stress applied to the frame 2a from the first lens barrel 19a or the second lens barrel 19b, and reduces cracks and breaks in the frame 2a.

The third bond 15 formed from a resin material is relatively soft. The image sensor mounting base 1 receiving distortion transferred from an external device can thus deform accordingly. This reduces the likelihood of the metal substrate 2d separating from the frame 2a.

One method for manufacturing the image sensor mounting base 1, the imaging device 21, and the imaging module 31 with the structure shown in FIGS. 10A, 10B, 11A, and 11B will be described. The frame 2a can be formed from an electrical insulating ceramic material with the method described in the first embodiment.

The metal substrate 2d is formed by, for example, punching a metal plate using a stamping die or etching a metal plate. The metal substrate 2d formed from a metal material such as an Fe—Ni—Co alloy, alloy 42, Cu, or a copper alloy may have surface plating with a Ni plating layer and a gold plating layer. The plating layer may effectively reduce oxidation and corrosion of the surface of the metal substrate 2d.

The frame 2a and the metal substrate 2d are then bonded together with the third bond 15. The third bond 15, which is a thermosetting resin (adhesive) paste, is applied to either or both the bonding surfaces of the substrate 2 or the metal substrate 2d by screen printing or dispensing. After the thermosetting resin is dried, the substrate 2 and the metal substrate 2d remaining stacked are then passed through a furnace, such as an oven or an atmosphere furnace having a tunnel structure, to press and heat the stack. The substrate 2 and the metal substrate 2d are firmly bonded with the thermoset bond.

The third bond 15 is formed from a main component such as a bisphenol A liquid epoxy resin, a bisphenol F liquid epoxy resin, or a phenolic novolac liquid resin, to which a filler such as spherical silicon oxide, a hardener containing an acid anhydride as a main component such as tetrahydromethylphthalic anhydride, and a coloring agent such as carbon powder are added. The mixture is mixed and kneaded with, for example, a centrifugal mixer into a paste. Other materials for the third bond 15 include a material formed by adding a hardener such as an imidazole-based, amine-based, phosphorus-based, hydrazine-based, imidazole adduct-based, amine adduct-based, cationic polymerization-based, or dicyandiamide-based hardener to an epoxy resin such as a bisphenol A epoxy resin, a bisphenol A modified epoxy resin, a bisphenol F epoxy resin, a phenolic novolac epoxy resin, a cresol novolac epoxy resin, a specialty novolac epoxy resin, a phenol derivative epoxy resin, or a bisphenol skeleton epoxy resin.

The first image sensor 10a and the second image sensor 10b are then mounted as in the first embodiment to complete the imaging device 21. Finally, the first lens barrel 19a and the second lens barrel 19b are mounted as in the first embodiment to complete the imaging module 31.

Fifth Embodiment

Figure 12A:
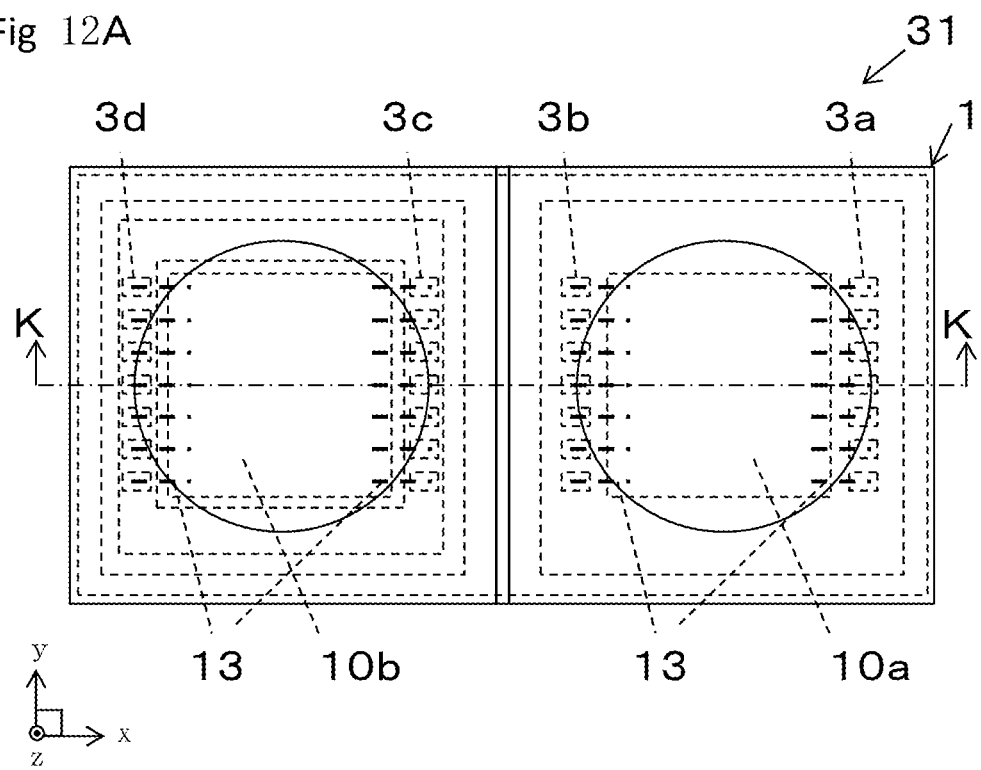
FIG. 12A is an external top view of an imaging module including an image sensor mounting base according to a fifth embodiment of the present invention.
Figure 12B:
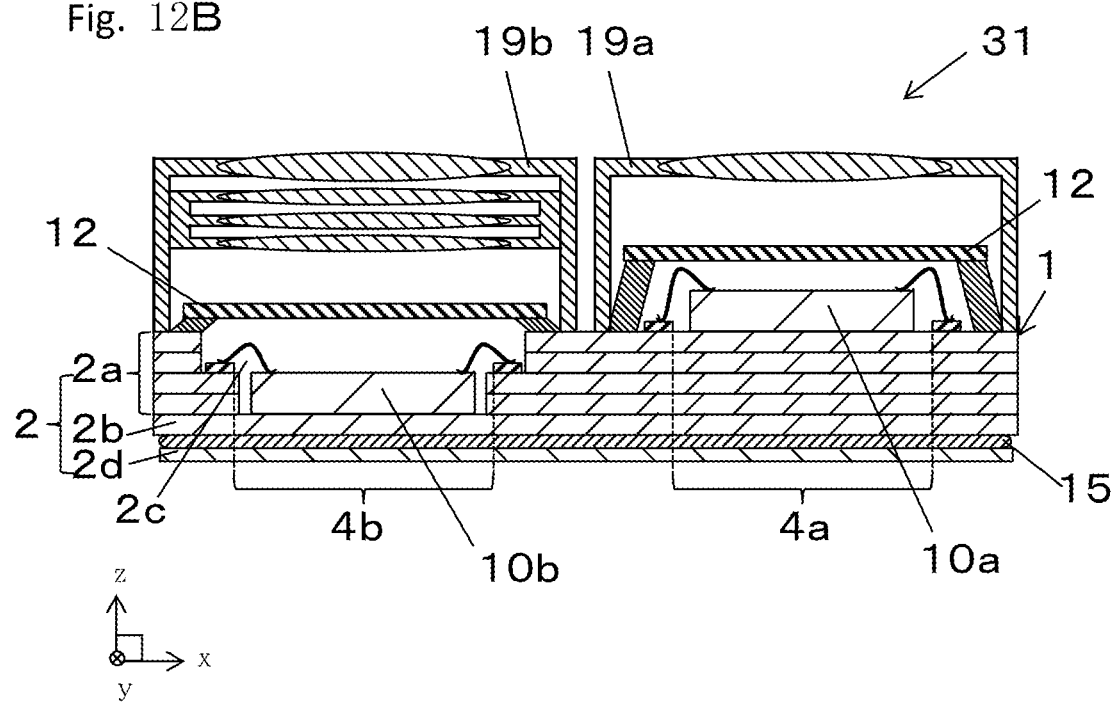
FIG. 12B is a cross-sectional view taken along line K-K in FIG. 12A.

An image sensor mounting base 1, an imaging device 21, and an imaging module 31 according to a fifth embodiment of the present invention will now be described with reference to FIGS. 12A and 12B. The image sensor mounting base 1, the imaging device 21, and the imaging module 31 according to the present embodiment differ from the image sensor mounting base 1, the imaging device 21, and the imaging module 31 according to the fourth embodiment in that a metal substrate 2d is used at the lower surface of a substrate 2.

The image sensor mounting base 1 according to the present embodiment includes the substrate 2 including multiple layers. The substrate 2 includes a frame 2a, a base 2b located on the lower surface of the frame 2a, and a metal substrate 2d located on the lower surface of the base 2b. Hereafter, the frame 2a is a portion having an opening defined by the sides of the recess 2c in the substrate 2 including multiple layers, the base 2b is a flat layer located on the lower surface of the frame 2a, and the metal substrate 2d is a metal substrate.

In the present embodiment, the substrate 2 includes the frame 2a, the base 2b, and the metal substrate 2d. This structure including the base 2b allows use of more inner wires and larger patterns connectable to a power source or to a ground than in the fourth embodiment. The metal substrate 2d improves heat dissipation, and improves electrical characteristics. This structure improves heat dissipation partly (in the second mount area 4b), and maintains or improves electrical characteristics. This reduces, for example, noise appearing in an image captured by the imaging module 31.

Further, the metal substrate 2d on the lower surface of the base 2b reinforces the structure under stress applied from the second lens barrel 19b. This structure strengthens the base 2b as the bottom of the recess 2c in the image sensor mounting base 1, and reduces cracks and breaks in the base 2b as the bottom of the recess 2c.

One method for manufacturing the image sensor mounting base 1, the imaging device 21, and the imaging module 31 with the structure shown in FIG. 12 will be described. The frame 2a and the base 2b can be formed from an electrical insulating ceramic material with the method described in the first embodiment. The metal substrate 2d is then prepared with the method described in the fourth embodiment.

The frame 2a, the base 2b, and the metal substrate 2d are then bonded with the method described in the fourth embodiment. As in the first embodiment, the frame 2a and the base 2b may be stacked on each other and pressed, and may be sintered together.

The first image sensor 10a and the second image sensor 10b are then mounted as in the first embodiment to complete the imaging device 21. Finally, the first lens barrel 19a and the second lens barrel 19b are mounted as in the first embodiment to complete the imaging module 31.

Sixth Embodiment

Figure 13A:
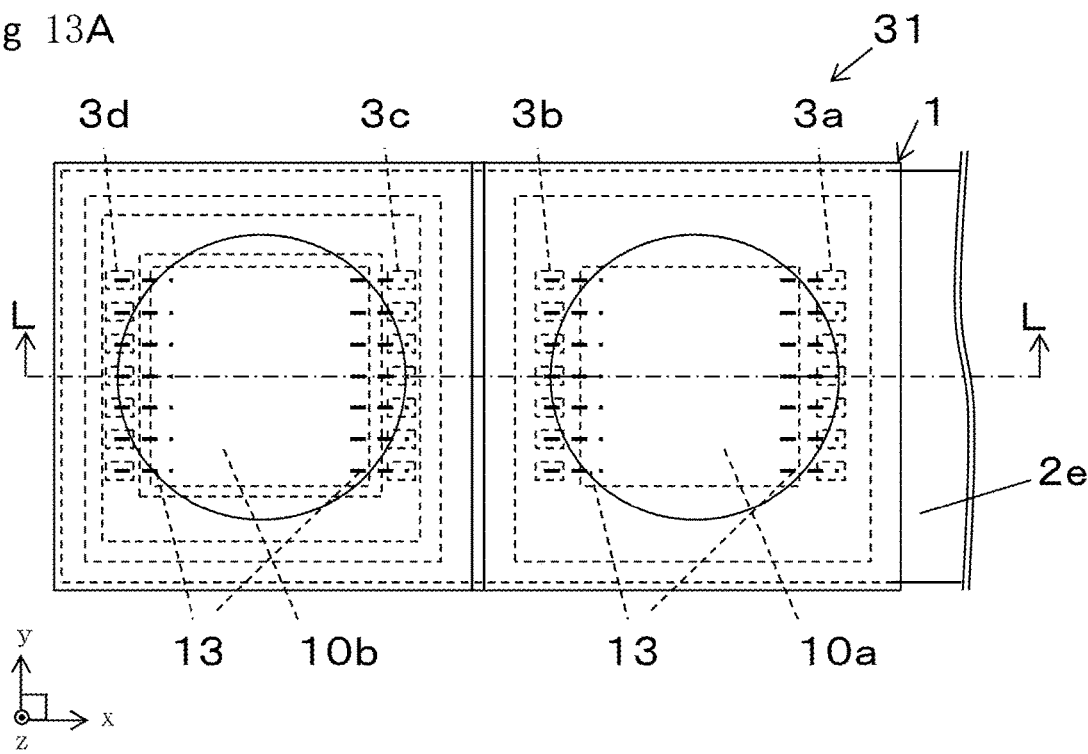
FIG. 13A is an external top view of an imaging module including an image sensor mounting base according to a sixth embodiment of the present invention.
Figure 13B:
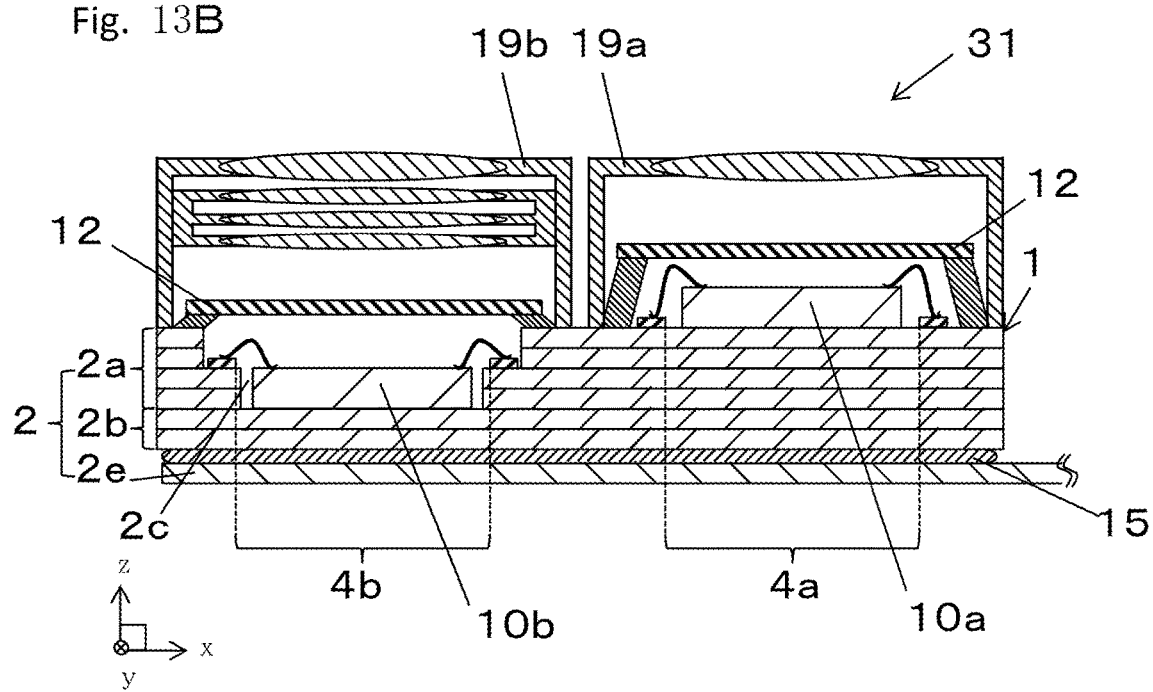
FIG. 13B is a cross-sectional view taken along line L-L in FIG. 13A.

An image sensor mounting base 1 according to a sixth embodiment of the present invention will now be described with reference to FIGS. 13A and 13B. The imaging module 31 according to the present embodiment differs from the imaging module 31 according to the first embodiment in that a substrate 2 includes a flexible board 2e.

The imaging module 31 according to the present embodiment includes the substrate 2 including multiple layers. The substrate 2 includes a flexible board 2e as its lowermost layer. When the substrate 2 in the imaging module 31 according to the present embodiment includes the flexible board 2e as the lowermost layer, the image sensor mounting base 1 can be downsized as compared with the structure for which the flexible board 2e is to be connected on the upper surface of the image sensor mounting base 1. Unlike the upper surface of the image sensor mounting base 1 on which the first electrode pads 3a, the second electrode pads 3b, the third electrode pads 3c, the fourth electrode pads 3d, the first lens barrel 19a, and the second lens barrel 19b are located, the lower surface of the image sensor mounting base 1 can have a larger area for connection, and enables connection between the image sensor mounting base 1 and the flexible board 2e with lower resistance. The flexible board 2e may be electrically connected to an external device.

Seventh Embodiment

An image sensor mounting base 1, an imaging device 21, and an imaging module 31 according to a seventh embodiment of the present invention will now be described with reference to FIGS. 14A and 14B. The image sensor mounting base 1, the imaging device 21, and the imaging module 31 according to the present embodiment differ from the image sensor mounting base 1, the imaging device 21, and the imaging module 31 according to the fourth embodiment in that the substrate 2 includes a flexible board 2e between a frame 2a and a metal substrate 2d.

The image sensor mounting base 1 according to the present embodiment includes the substrate 2 including multiple layers. The substrate 2 includes the frame 2a having an opening defined by the sides of the recess 2c and the metal substrate 2d as the bottom of the recess 2c, and the flexible board 2e having a through-hole to be the recess 2c between the frame 2a and the metal substrate 2d.

In the present embodiment, the substrate 2 includes the flexible board 2e with the through-hole to be the recess 2c. This structure allows electrical connection between the image sensor mounting base 1 and an external device, and shortens the direct distance from the second image sensor 10b to the external device without through the flexible base 2e. When the imaging module 31 operates and releases heat generated in the second image sensor 10b, this structure improves thermal conductivity for heat dissipation. The flexible board 2e may include inner wires typically made of copper. Any heat transferred from the second image sensor 10b to the frame 2a and accumulating in the frame 2a can be released to an external housing through the inner wires in the flexible board 2e. Also, the substrate 2 includes the flexible board 2e with inner wires made of copper to further improve the electrical characteristics of the substrate 2. This structure improves heat dissipation further, and maintains and improves electrical characteristics. This reduces noise appearing in an image captured by the imaging module 31.

The flexible board 2e is typically flexible, and absorbs stress applied on the lower surface of the image sensor mounting base 1. This reduces cracks and breaks in the frame 2a. This structure also reduces deformation of the metal substrate 2d caused by stress applied from the first lens barrel 19a and the second lens barrel 19b.

In the present embodiment, the metal substrate 2d reinforces the structure to reduce distortion in the substrate 2. This reduces cracks and breaks in the image sensor mounting base 1, and also reduces separation between the frame 2a and the flexible board 2e. The flexible board 2e is electrically connected to the frame 2a, and may serve as an external circuit for electrically connecting to an external device.

The flexible board 2e may include a base film. Examples of the material for the base film include an insulator formed from a resin, such as a polyimide film. The flexible board 2e may further include a conductive layer on the base film. The conductive layer is formed from, for example, copper, aluminum, gold, or nickel, or an alloy containing one or more of these metals.

The uncovered surface of the conductive layer may be plated. The plating layer protects the surface of the conductive layer against oxidation. This structure also improves electrical connection between the substrate 2 and the conductive layer. The plating layer may be, for example, a Ni plating layer with a thickness of 0.5 to 10 µm, and the Ni plating layer may further be coated with a gold (Au) plating layer with a thickness of 0.5 to 3 µm. The plating layer may further be plated with Sn.

The flexible board 2e includes a cover film on the upper surface of the conductive layer. The cover film protects the surface of the conductive layer. The film is formed from a resin material, such as a polyimide film, and has a second bond applied on one surface. The film is located on the surface of the conductive layer excluding its portions to be electrically connected to the frame 2a. The flexible board 2e and the frame 2a may be connected with the conductive third bond 15.

The third bonds 15 for bonding the frame 2*a* to the flexible board 2*e* and the flexible board 2*e* to the metal substrate 2*d* may be formed from a material that is less likely to alter with heat applied in the process of mounting the first image sensor 10*a* and the second image sensor 10*b*. Examples of the third bond 15 include a bisphenol A liquid epoxy resin and a polyimide resin. This structure also effectively reduces the likelihood that the frame 2*a*, the flexible board 2*e*, and the metal substrate 2*d* are separated from one another in the process of mounting the first image sensor 10*a* and the second image sensor 10*b*.

The third bond 15 may be conductive to electrically connect the frame 2*a* to the flexible board 2*e* or the flexible board 2*e* to the metal substrate 2*d*. The frame 2*a* and the metal substrate 2*d* have the same ground potential through some of the inner wires in the flexible board 2*e* to allow the metal substrate 2*d* to serve as a shield for protecting the first image sensor 10*a* and the second image sensor 10*b* from external noise. Examples of the conductive third bond 15 include silver epoxy, solder, an ACP, and an ACF. The third bond 15 for bonding the frame 2*a* and the flexible board 2*e* may be the same as or different from the third bond 15 for bonding the flexible board 2*e* and the metal substrate 2*d*.

Figure 14A:
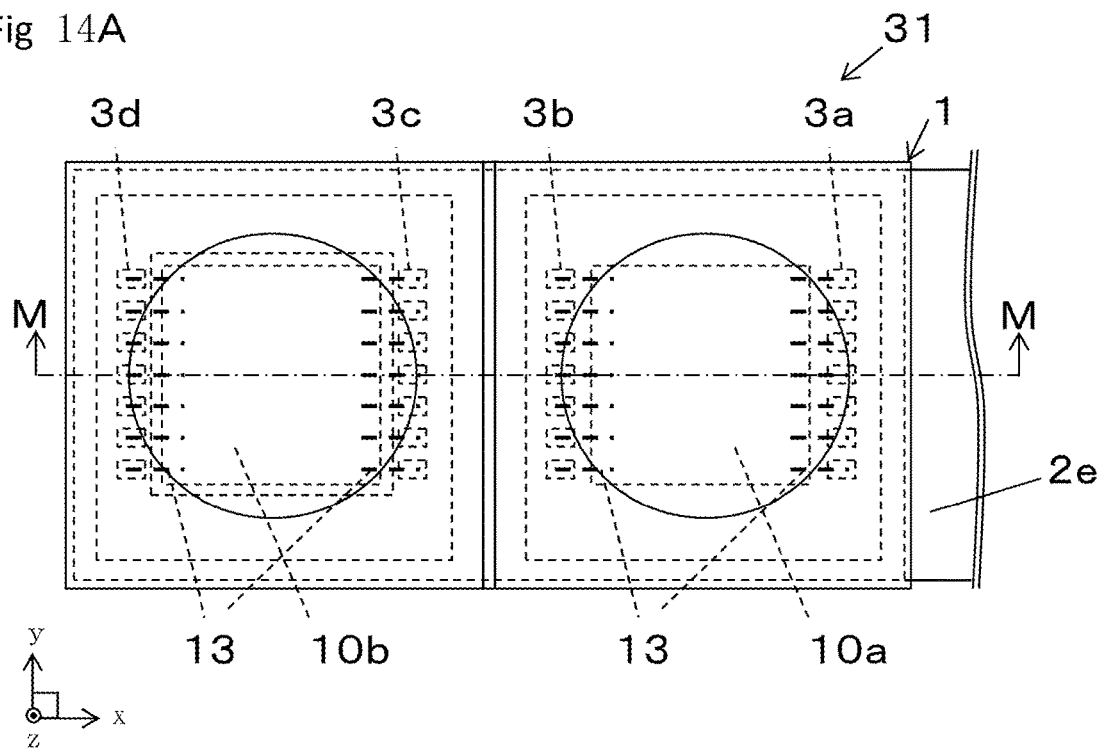
FIG. 14A is an external top view of an imaging module including an image sensor mounting base according to a seventh embodiment of the present invention.
Figure 14B:
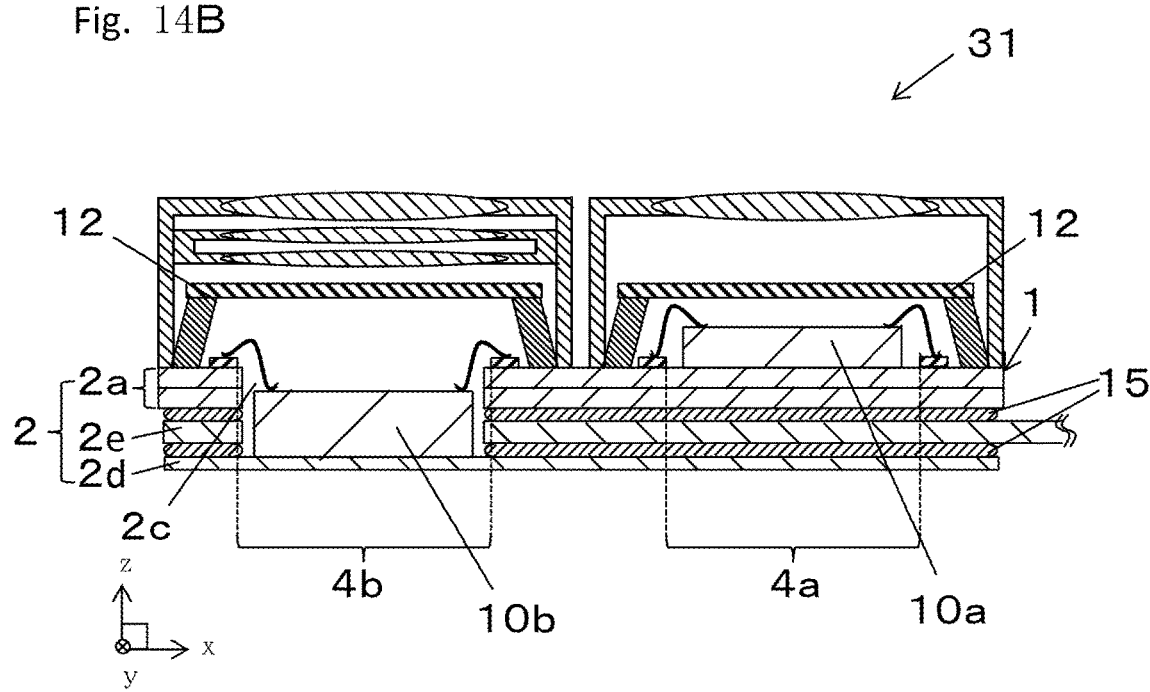
FIG. 14B is a cross-sectional view taken along line M-M in FIG. 14A.

In the example shown in FIGS. 14A and 14B, the outer edge of the flexible board 2*e* is partially located inward from the outer edge of the frame 2*a* as viewed from above. When the outer edge of the flexible board 2*e* is partially aligned with or located inward from the outer edge of the frame 2*a*, this structure allows the outer profile of the image sensor mounting base 1 to be entirely uniform in correspondence with the outer edge of the frame 2*a*. This structure can thus further downsize the image sensor mounting base 1, and easily achieve uniform external dimensions of the image sensor mounting base 1. The outer edge of the flexible board 2*e* may be partially located outward from the outer edge of the frame 2*a* as viewed from above.

One method for manufacturing the image sensor mounting base 1, the imaging device 21, and the imaging module 31 with the structure shown in FIGS. 14A and 14B will be described. The frame 2*a* can be formed from an electrical insulating ceramic material with the method described in the first embodiment. The metal substrate 2*d* is then prepared with the method described in the fourth embodiment.

The flexible board 2*e* will now be prepared. The flexible board 5 can be prepared through the process of preparing a substrate by forming a photoresist layer on a polyimide substrate or by development etching stripping (DES), followed by the process of bonding a cover film of polyimide on the upper surface of a circuit pattern formed on the substrate.

The frame 2*a*, the metal substrate 2*d*, and the flexible board 2*e* are then bonded together. The first image sensor 10*a* and the second image sensor 10*b* are then mounted as in the first embodiment to complete the imaging device 21. Finally, the first lens barrel 19*a* and the second lens barrel 19*b* are mounted as in the first embodiment to complete the imaging module 31.

Eighth Embodiment

An image sensor mounting base 1, an imaging device 21, and an imaging module 31 according to an eighth embodiment of the present invention will now be described with reference to FIGS. 15A and 15B. The image sensor mounting base 1, the imaging device 21, and the imaging module 31 according to the present embodiment differ from the image sensor mounting base 1, the imaging device 21, and the imaging module 31 according to the first embodiment in that a substrate 2 has a second substrate 5 on its upper surface.

The substrate 2 in the image sensor mounting base 1 according to the present embodiment has, on its upper surface, the second substrate 5, which has a through-hole at a position overlapping a first mount area 4*a* and/or a second mount area 4*b* as viewed from above. In this structure as well, the second image sensor 10*b* is located at a lower level than the first image sensor 10*a* in cross-section. The second image sensor 10*b* thus has a larger distance from its upper surface to the second lens barrel 19*b* than the first image sensor 10*a*. In this structure, the second lens barrel 19*b* for the second image sensor 10*b* can include more lenses, have a larger thickness, or include an additional mechanism without greatly increasing the height. This minimizes the thickness of each lens barrel 19, and reduces the height of the imaging module 31.

In the present embodiment, the second substrate 5 is located on the upper surface of the substrate 2 to adjust the distance from the upper surface of the first image sensor 10*a* and the distance from the second image sensor 10*b* to the first lens barrel 19*a* and the second lens barrel 19*b*. Thus, the first lens barrel 19*a* and the second lens barrel 19*b* can be used commonly, irrespective of the numbers of pixels of and types of the first image sensor 10*a* and the second image sensor 10*b*. The cost of the imaging module 31 is prevented from increasing.

Examples of the electrical insulating ceramic material used for the second substrate 5 include sintered aluminum oxide, sintered mullite, sintered silicon carbide, sintered aluminum nitride, sintered silicon nitride, and sintered glass ceramic. Examples of the resin used for forming the second substrate 5 include an epoxy resin, a polyimide resin, an acryl resin, a phenolic resin, and a fluorine-based resin. Examples of the fluorine-based resin include a polyester resin and a polytetrafluoroethylene resin.

The second substrate 5 may be a laminate of multiple insulating layers stacked on one another. The insulating layers are formed from any of the above listed materials. The second substrate 5 may include two insulating layers as shown in FIGS. 15A and 15B, or may be formed from a single insulating layer, or may include three or more insulating layers.

Figure 15A:
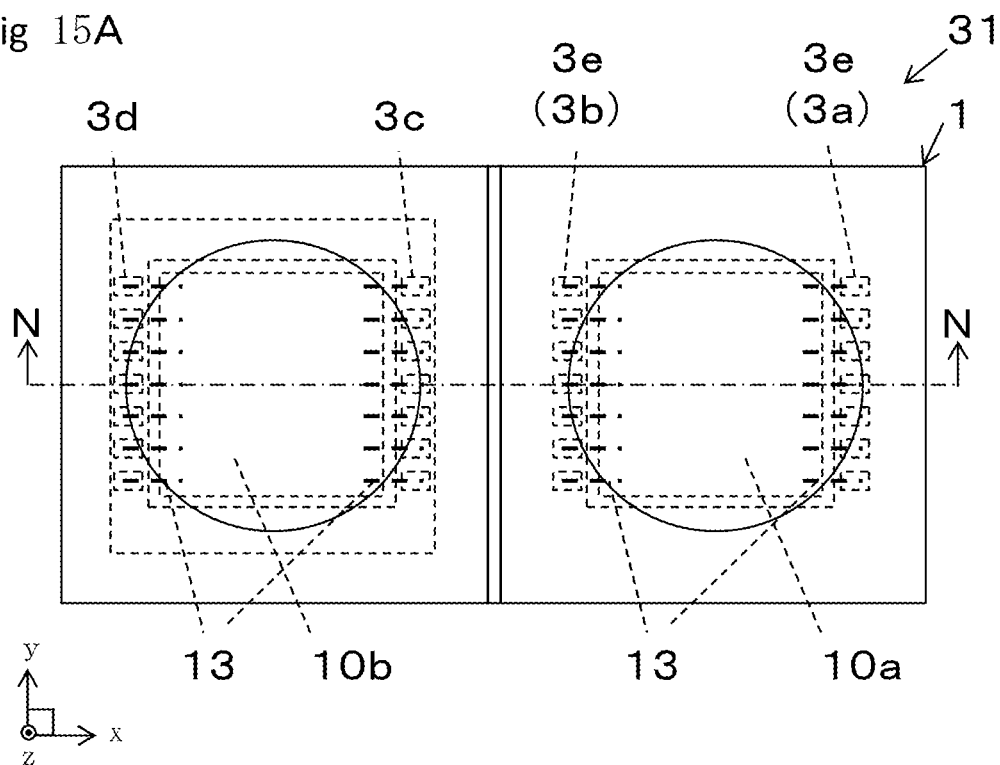
FIG. 15A is an external top view of an imaging module including an image sensor mounting base according to an eighth embodiment of the present invention.
Figure 15B:
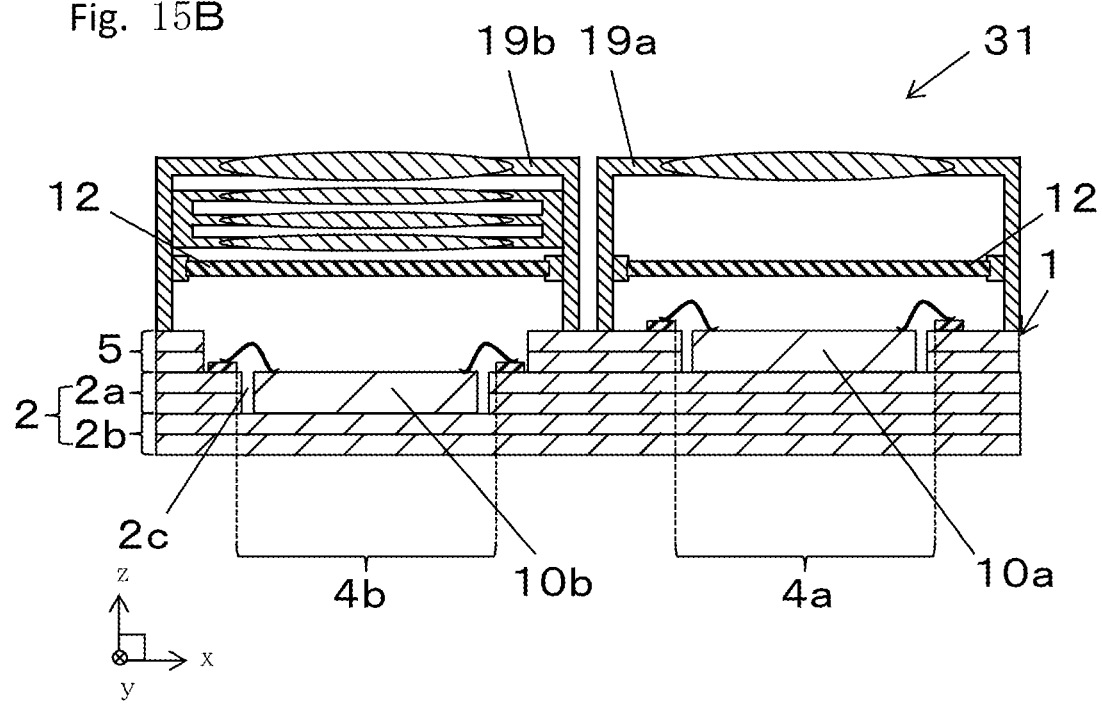
FIG. 15B is a cross-sectional view taken along line N-N in FIG. 15A.

The second substrate 5 may have a through-hole with substantially the same size as the through-hole in the substrate 2 and overlapping the first mount area 4*a* and the second mount area 4*b* as shown in FIGS. 15A and 15B. This structure can adjust the heights of both the first lens barrel 19*a* and the second lens barrel 19*b*. An upper surface portion of the second substrate 5 overlapping the first lens barrel 19*a* as viewed from above and an upper surface portion of the second substrate 5 overlapping the second lens barrel 19*b* as viewed from above may differ from each other in vertical cross-section. This structure allows more flexible selection of the first lens barrel 19*a* and the second lens barrel 19*b*, which are to be used commonly.

In some embodiments, the second substrate 5 may have a through-hole smaller than the through-hole in the substrate 2 at a position overlapping either the first mount area 4*a* or the second mount area 4*b*. This structure allows more flexible selection of the first lens barrel 19*a* and the second lens barrel 19*b*, which are to be used commonly.

The substrate 2 and the second substrate 5 may be formed from the same material or from different materials. The substrate 2 and the second substrate 5 formed from the same material, or for example from an electrical insulating ceramic material, can be bonded together more firmly by sintering. The substrate 2 and the second substrate 5 can have different physical properties to improve manufacturing efficiency.

The second substrate 5 may have auxiliary electrode pads 3e on its upper surface, which may be electrically connected to the first electrode pads 3a, the second electrode pads 3b, the third electrode pads 3c, and the fourth electrode pads 3d located on the upper surface of the substrate 2. The second substrate 5 may include, either inside or between its insulating layers, inner wires and feedthrough conductors that vertically connect the inner wires. The inner wires and the feedthrough conductors may be uncovered on the surface of the second substrate 5. The inner wires or the feedthrough conductors may electrically connect the auxiliary electrode pads 3e to the first electrode pads 3a, the second electrode pads 3b, the third electrode pads 3c, and the fourth electrode pads 3d. On the second substrate 5 with the auxiliary electrode pads 3e, each of the first mount area 4a and the second mount area 4b may be an area surrounded by the corresponding auxiliary electrode pads 3e.

For the second substrate 5 formed from an electrical insulating ceramic material, the auxiliary electrode pads 3e, the inner wires inside the second substrate 5, and the feedthrough conductors in the second substrate 5 may be formed from tungsten (W), molybdenum (Mo), manganese (Mn), silver (Ag), or copper (Cu), or an alloy containing one or more of these metals. For the second substrate 5 formed from a resin, the auxiliary electrode pads 3e, the inner wires inside the second substrate 5, and the feedthrough conductors in the second substrate 5 may be formed from copper (Cu), gold, (Au), aluminum (Al), nickel, (Ni), molybdenum (Mo), or titanium (Ti), or an alloy containing one or more of these metals.

The uncovered surfaces of the auxiliary electrode pads 3e, the inner wires inside the second substrate 5, and the feedthrough conductors in the second substrate 5 may be plated. This structure covers the uncovered surfaces of the auxiliary electrode pads 3e, the inner wires inside the second substrate 5, and the feedthrough conductors in the second substrate 5 and protects the surfaces against oxidation. Also, this structure can electrically connect the auxiliary electrode pads 3e and the first image sensor 10a or the second image sensor 10b in an appropriate manner through first bonds 13, such as bonding wires, thus improving the bonding strength. The plating layer may be, for example, a Ni plating layer with a thickness of 0.5 to 10 or the Ni plating layer may further be coated with a gold (Au) plating layer with a thickness of 0.5 to 3 μm.

One method for manufacturing the image sensor mounting base 1, the imaging device 21, and the imaging module 31 with the structure shown in FIGS. 15A and 15B will be described. The substrate 2 and the second substrate 5 can be formed from the same material with the method described in the first embodiment. For the substrate 2 and the second substrate 5 formed from an electrical insulating ceramic material, ceramic green sheets to be the substrate 2 and ceramic green sheets to be the second substrate 5 may be stacked on one another and pressed in the process of stacking and pressing these sheets, and then may be sintered together. In some embodiments, the sheets to be the substrate 2 and the sheets to be the second substrate 5 may be sintered separately into the substrate 2 and the second substrate 5, which may then be bonded together with another member. For the second substrate 5 with the auxiliary electrode pads 3e, the other member may be conductive to electrically connect the substrate 2 and the second substrate 5.

For the substrate 2 and the second substrate 5 formed from different materials, the substrate 2 and the second substrate 5 are prepared first, and then may be bonded together with another member. For the second substrate 5 with the auxiliary electrode pads 3e, the other member may be conductive to electrically connect the substrate 2 and the second substrate 5.

Ninth Embodiment

An image sensor mounting base 1, an imaging device 21, and an imaging module 31 according to a ninth embodiment of the present invention will now be described with reference to FIG. 16. The image sensor mounting base 1, the imaging device 21, and the imaging module 31 according to the present embodiment differ from the image sensor mounting base 1, the imaging device 21, and the imaging module 31 according to the first embodiment in that a second recess 2f smaller than a first mount area 4a is at a position overlapping a first mount area 4a on a substrate 2, and an electronic component 11 is mounted on the second recess 2f.

The substrate 2 in the image sensor mounting base 1 according to the present embodiment has the second recess 2f smaller than the first mount area 4a at a position overlapping the first mount area 4a in the substrate 2. The imaging device 21 according to the present embodiment has the second recess 2f accommodating the electronic component 11. The first image sensor 10a is mounted to partially close the second recess 2f. The imaging device 21 and the imaging module 31 may typically incorporate the electronic component 11, in addition to the first image sensor 10a and the second image sensor 10b. The substrate 2 has the second recess 2f overlapping the first mount area 4a and smaller than the first mount area 4a, and allows the electronic component 11 to be accommodated in the second recess 2f. The image sensor mounting base 1, the imaging device 21, and the imaging module 31 can be downsized as compared with when the electronic component 11 is mounted on the upper surface of the substrate 2.

In this structure as well, the first image sensor 10a is mounted on the upper surface of the substrate 2, and the second image sensor 10b is located at a level lower than the first image sensor 10a in cross-section. The second image sensor 10b mounted in the recess 2c can thus have a larger distance from its upper surface to a second lens barrel 19b than the first image sensor 10a. In this structure, the second lens barrel 19b for the second image sensor 10b can include more lenses, have a larger thickness, or include an additional mechanism without greatly increasing the height. This minimizes the thickness of each lens barrel 19, and thus reduces the height of the imaging module 31 and downsizes the imaging module 31.

Examples of the electronic component 11 include passive components including chip capacitors, inductors, and resistors, and active components including optical image stabilizers (OISs), signal processors, and gyro sensors. Such an electronic component 11 is connected to a wire located on the substrate 2 with a bond, such as solder, a conductive resin, or a bonding wire. The electronic component 11 may be connected to the first image sensor 10a and the second image sensor 10b with an inner wire or other connections located in the substrate 2.

The imaging device 21 may have the second recess 2f filled with, for example, a sealant after the electronic component 11 is mounted. This structure reduces mounting failures or misalignment in mounting the first image sensor 10a due to deformation of the first image sensor 10a at a position overlapping the second recess 2f as viewed from above. The image sensor mounting base 1, the imaging device 21, and the imaging module 31 shown in FIG. 15 can be manufactured with the same method as described in the first embodiment except that the second recess 2f is formed with the same process as described for the recess 2c.

Tenth Embodiment

Figure 17A:
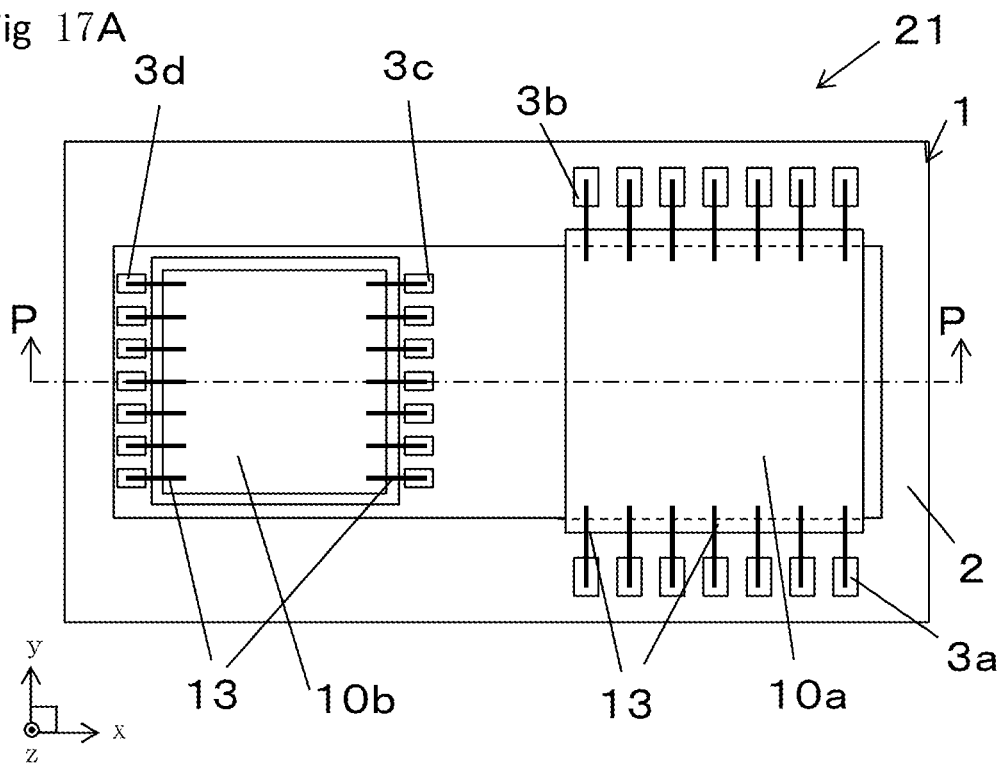
FIG. 17A is an external top view of an image sensor mounting base and an imaging device according to a tenth embodiment of the present invention.
Figure 17B:
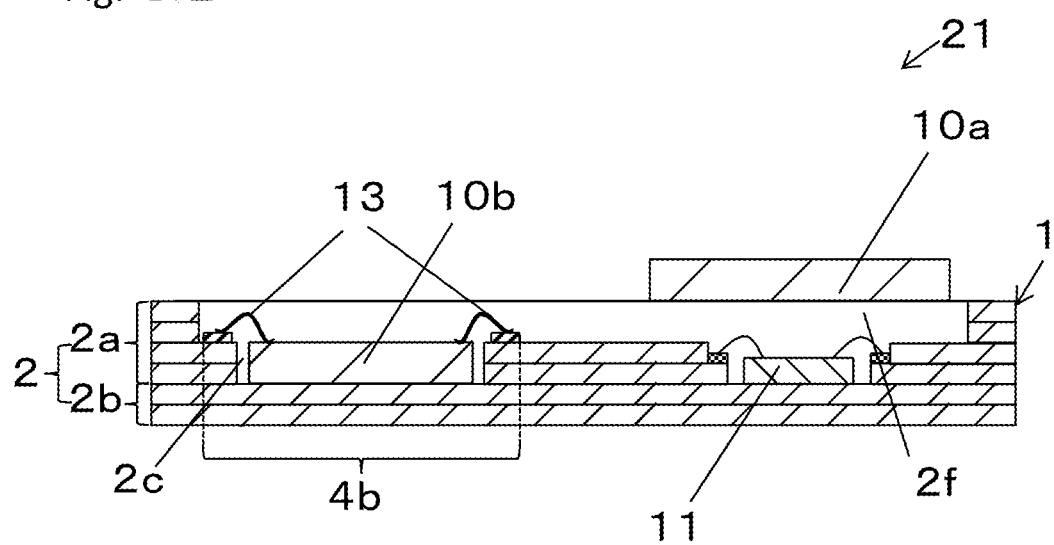
FIG. 17B is a cross-sectional view taken along line P-P in FIG. 17A.

An image sensor mounting base 1 and an imaging device 21 according to a tenth embodiment of the present invention will now be described with reference to FIGS. 17A and 17B. The image sensor mounting base 1 and the imaging device 21 according to the present embodiment differ from the image sensor mounting base 1 and the imaging device 21 according to the ninth embodiment in that a second recess 2f larger than a first mount area 4a is at a position overlapping a first mount area 4a on a substrate 2, and a recess 2c is at a position overlapping the second recess 2f.

The substrate 2 in the image sensor mounting base 1 according to the present embodiment has the second recess 2f at a position overlapping the first mount area 4a and the second mount area 4b in the substrate 2, and the recess 2c is located inside the second recess 2f. The imaging device 21 according to the present embodiment has the second recess 2f accommodating the electronic component 11. The first image sensor 10a is mounted to partially close the recess 2f. In the present embodiment, the image sensor mounting base 1, the imaging device 21, and the imaging module 31 can be downsized as compared with when the electronic component 11 is mounted on the upper surface of the substrate 2. In this structure as well, the first image sensor 10a is mounted on the upper surface of the substrate 2, and the second image sensor 10b is located at a level lower than the first image sensor 10a in cross-section. The second image sensor 10b mounted in the recess 2c thus has a larger distance from its upper surface to the second lens barrel 19b than the first image sensor 10a. In this structure, the second lens barrel 19b for the second image sensor 10b can include more lenses, have a larger thickness, or include an additional mechanism without greatly increasing the height. This minimizes the thickness of each lens barrel 19, and thus reduces the height of the imaging module 31 and downsizes the imaging module 31.

The present invention is not limited to the examples described in the above embodiments. All the embodiments according to the present invention may be variously modified, including numerical values. Various combinations of the features of the embodiments are not limited to the above examples in the embodiments. The embodiments of the present invention may be combined in any manner unless any contradiction arises.

REFERENCE SIGNS LIST 1 image sensor mounting base
2 substrate
2a frame
2b base
2c recess
2d metal substrate
2e flexible board
2f second recess
3 electrode pad
3a first electrode pad
3b second electrode pad
3c third electrode pad
3d fourth electrode pad
3e auxiliary electrode pad
4 mount area
4a first mount area
4b second mount area
5 second substrate
9 external circuit connecting pad
10 image sensor
10a first image sensor
10b second image sensor
11 electronic component
12 lid
13 first bond
14 second bond
15 third bond
19 lens barrel
19a first lens barrel
19b second lens barrel
21 imaging device
31 imaging module

The invention claimed is:

1. An image sensor mounting, comprising:
   a substrate including an upper surface including a first mount area on which a first image sensor is mountable, and a second mount area on which a second image sensor is mountable, the second mount area being spaced from the first mount area;
   a first electrode pad and a second electrode pad that are located on the upper surface of the substrate and across the first mount area each other; and
   a third electrode pad and a fourth electrode pad on the upper surface of the substrate, the third electrode pad and the fourth electrode pad being spaced from the first electrode pad and the second electrode pad, and acrossing the second mount area each other,
   wherein
   the substrate including, on the upper surface, a first recess between the third electrode pad and the fourth electrode pad, and the second mount area are located on a bottom of the first recess, and
   the substrate includes a first portion nearest the upper surface and a second portion second nearest the upper surface, and the first recess in the substrate has an end protruding more inwardly in the first portion than in the second portion.

2. The image sensor mounting base according to claim 1, wherein
   the substrate includes a plurality of layers including a lowermost layer that is a metal substrate.

3. The image sensor mounting base according to claim 1, wherein
   the first recess in the substrate has an end with a round edge.

4. The image sensor mounting base according to claim 1, wherein
   the first recess has a side wall inclined from an upper end toward a lower end of the first recess.

5. The image sensor mounting base according to claim 1, wherein
   the substrate includes a plurality of layers including a flexible board.

6. The image sensor mounting base according to claim 1, wherein the substrate has a second recess at a position overlapping the first mount area.

7. The image sensor mounting base according to claim 6, wherein
the second recess has a bottom on which an electronic component is mountable.

8. An imaging device, comprising:
the image sensor mounting base according to claim 1;
a first image sensor mounted on the first mount area on the image sensor mounting base; and
a second image sensor mounted on the second mount area on the image sensor mounting base.

9. An imaging module, comprising:
the imaging device according to claim 8;
a first lens barrel bonded to an upper surface of the imaging device and surrounding the first mount area; and
a second lens barrel bonded to the upper surface of the imaging device and surrounding the second mount area.

10. The image sensor mounting base according to claim 1, wherein
the substrate includes a plurality of layers including a first layer nearest the upper surface and a second layer second nearest the upper surface, and
the first portion consists of the first layer and the second portion consists of the second layer.

\* \* \* \* \*